(12) United States Patent
Lee et al.

(10) Patent No.: US 12,495,699 B2
(45) Date of Patent: Dec. 9, 2025

(54) DISPLAY DEVICE WITH AUXILIARY SOURCE AND DRAIN ELECTRODES AND MANUFACTURING METHOD THEREOF

(71) Applicant: Samsung Display Co., Ltd., Yongin-si (KR)

(72) Inventors: Jaemin Lee, Asan-si (KR); Hyung Gi Jung, Cheonan-si (KR); Seul-Ki Kim, Incheon (KR); Soon Chang Yeon, Seongnam-si (KR); Hyungtae Jung, Asan-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 745 days.

(21) Appl. No.: 17/864,253

(22) Filed: Jul. 13, 2022

(65) Prior Publication Data

US 2023/0200106 A1  Jun. 22, 2023

(30) Foreign Application Priority Data

Dec. 16, 2021  (KR) .......................... 10-2021-0180601

(51) Int. Cl.
*H10K 59/80* (2023.01)
*H10K 59/12* (2023.01)
(Continued)

(52) U.S. Cl.
CPC ..... *H10K 59/80516* (2023.02); *H10K 59/131* (2023.02); *H10K 59/80522* (2023.02);
(Continued)

(58) Field of Classification Search
CPC .. H10K 50/814; H10K 50/824; H10K 50/865; H10K 59/131; H10K 59/1201; H10K 71/00
(Continued)

(56) References Cited

U.S. PATENT DOCUMENTS 8,318,554 B2 * 11/2012 Arai ................... H10D 30/6739
438/149
9,059,432 B2 * 6/2015 Kim ..................... H10K 59/123
(Continued)

FOREIGN PATENT DOCUMENTS

KR    10-1041147 B1    6/2011
KR    10-1255834 B1    4/2013
(Continued)

*Primary Examiner* — Eric W Jones
(74) *Attorney, Agent, or Firm* — Womble Bond Dickinson (US) LLP

(57) ABSTRACT

A display device includes: a substrate; a semiconductor on the substrate, and including a channel, a first region, and a second region; an auxiliary insulating layer on the semiconductor; a first auxiliary electrode on the auxiliary insulating layer, and overlapping with the first region of the semiconductor; a second auxiliary electrode on the auxiliary insulating layer, and overlapping with the second region of the semiconductor; a gate electrode on the auxiliary insulating layer, and overlapping with the channel of the semiconductor; a first electrode on the first auxiliary electrode, and connected to the first region of the semiconductor; and a second electrode on the second auxiliary electrode, and connected to the second region of the semiconductor.

20 Claims, 15 Drawing Sheets

(51) Int. Cl.
   *H10K 59/131*     (2023.01)
   *H10K 71/00*      (2023.01)
(52) U.S. Cl.
   CPC ......... *H10K 59/8792* (2023.02); *H10K 71/00* (2023.02); *H10K 59/1201* (2023.02)
(58) Field of Classification Search
   USPC .............................................. 257/40, 59, 99
   See application file for complete search history.

(56) References Cited

U.S. PATENT DOCUMENTS

| | | | | |
|---|---|---|---|---|
| 9,299,723 | B2* | 3/2016 | Saito | H10D 86/423 |
| 9,660,090 | B2* | 5/2017 | Yoon | H10K 59/126 |
| 9,799,717 | B2* | 10/2017 | Jung | H10K 59/805 |
| 10,038,049 | B2* | 7/2018 | Gang | H10K 59/131 |
| 10,192,935 | B2* | 1/2019 | Shim | H10K 59/1315 |
| 10,367,046 | B2* | 7/2019 | Lee | H10K 59/131 |
| 11,189,646 | B2* | 11/2021 | Ding | H10D 86/60 |
| 11,217,698 | B2* | 1/2022 | Luo | H10D 30/6734 |
| 11,335,756 | B2* | 5/2022 | Zhang | H10D 86/60 |
| 11,402,715 | B2* | 8/2022 | Hong | H10K 59/131 |
| 11,417,282 | B2* | 8/2022 | Park | H10K 71/00 |
| 11,462,602 | B2* | 10/2022 | Huang | H10K 59/1213 |
| 11,751,440 | B2* | 9/2023 | Zheng | H10K 71/00 345/204 |
| 11,765,939 | B2* | 9/2023 | Jeon | G09G 3/3233 257/71 |
| 11,765,947 | B2* | 9/2023 | Jeon | H10K 59/122 |
| 11,855,104 | B2* | 12/2023 | Hwang | G09G 3/3233 |
| 11,882,742 | B2* | 1/2024 | Son | H10D 30/6723 |
| 12,062,664 | B2* | 8/2024 | Lee | H10D 86/60 |
| 12,075,644 | B2* | 8/2024 | Wang | H10K 71/00 |
| 12,150,344 | B2* | 11/2024 | Kim | H10K 59/1213 |
| 12,200,989 | B2* | 1/2025 | Li | H10K 59/1213 |
| 12,207,504 | B2* | 1/2025 | Cao | H10D 86/481 |
| 12,284,877 | B2* | 4/2025 | Yuan | H10K 59/8792 |
| 2006/0001091 | A1* | 1/2006 | Kim | H10D 86/60 438/149 |
| 2006/0246633 | A1* | 11/2006 | Arai | H10D 30/0314 438/149 |
| 2008/0191207 | A1* | 8/2008 | Nishiura | H10D 30/6713 257/E21.429 |
| 2015/0144904 | A1* | 5/2015 | Jeong | H10K 59/1213 438/4 |
| 2015/0179724 | A1* | 6/2015 | Lee | H10K 59/12 438/23 |
| 2015/0379923 | A1* | 12/2015 | Lee | H10K 59/1315 345/82 |
| 2016/0035814 | A1* | 2/2016 | Jin | H10D 86/0231 438/23 |
| 2016/0293771 | A1* | 10/2016 | Long | H01L 23/3171 |
| 2017/0077203 | A1* | 3/2017 | Hsu | H10D 64/666 |
| 2017/0186784 | A1* | 6/2017 | Yang | H10D 30/0321 |
| 2017/0278916 | A1* | 9/2017 | Maruyama | H10K 59/1213 |
| 2017/0365649 | A1* | 12/2017 | Kim | H10K 59/122 |
| 2018/0061870 | A1* | 3/2018 | Yang | H10D 99/00 |
| 2020/0381524 | A1* | 12/2020 | Xu | H10D 30/6723 |
| 2021/0020721 | A1* | 1/2021 | Kwack | H10K 59/122 |
| 2021/0181554 | A1* | 6/2021 | Hong | H10K 59/131 |
| 2021/0202910 | A1* | 7/2021 | Lee | H10K 59/1213 |
| 2021/0327987 | A1* | 10/2021 | Fang | H10K 50/818 |
| 2021/0408441 | A1* | 12/2021 | Lee | H10K 50/814 |
| 2022/0392987 | A1* | 12/2022 | Liu | H10K 71/00 |
| 2023/0122411 | A1* | 4/2023 | Yuan | H10K 59/1216 345/206 |
| 2023/0122965 | A1* | 4/2023 | He | H10K 59/1213 257/40 |
| 2023/0180563 | A1* | 6/2023 | Xu | H10D 86/411 257/40 |
| 2023/0189564 | A1* | 6/2023 | Zhang | H10D 86/441 257/71 |

FOREIGN PATENT DOCUMENTS

| | | |
|---|---|---|
| KR | 10-1322732 B1 | 10/2013 |
| KR | 10-2017-0143082 A | 12/2017 |
| KR | 10-1949389 B1 | 2/2019 |

* cited by examiner

DISPLAY DEVICE WITH AUXILIARY SOURCE AND DRAIN ELECTRODES AND MANUFACTURING METHOD THEREOF

CROSS-REFERENCE TO RELATED APPLICATION

This application claims priority to and the benefit of Korean Patent Application No. 10-2021-0180601, filed in the Korean Intellectual Property Office on Dec. 16, 2021, the entire content of which is incorporated by reference herein.

BACKGROUND

1. Field

Aspects of one or more embodiments of the present disclosure relate to a display device and a manufacturing method thereof.

2. Description of the Related Art

A display device is a device for displaying an image, and includes a liquid crystal display (LCD), an organic light emitting diode (OLED) display, and the like. The display device is used in various electronic devices, such as a mobile phone, a navigation device, a digital camera, an electronic book, a portable game machine, and various terminals.

An organic light emitting display device includes two electrodes, and an organic light emitting layer interposed therebetween. Electrons injected from one electrode and holes injected from another electrode are combined in the organic light emitting layer to generate excitons. The generated excitons are changed to a ground state from an excited state, releasing energy to emit light.

Such an organic light emitting display device includes a plurality of pixels including an organic light emitting diode, which is a self-emissive element. In each pixel, a plurality of transistors for driving the organic light emitting diode and at least one capacitor may be formed.

The above information disclosed in this Background section is for enhancement of understanding of the background of the present disclosure, and therefore, it may contain information that does not constitute prior art.

SUMMARY

A transistor configuring a display device may include a semiconductor, and when other metal layers remain on a channel of the semiconductor without being properly removed, a defect may occur in the transistor.

One or more embodiments of the present disclosure are directed to a display device, and a manufacturing method of the display device in which a defect may be prevented or substantially prevented from occurring in a transistor.

According to one or more embodiments of the present disclosure, a display device includes: a substrate; a semiconductor on the substrate, and including a channel, a first region, and a second region; an auxiliary insulating layer on the semiconductor; a first auxiliary electrode on the auxiliary insulating layer, and overlapping with the first region of the semiconductor; a second auxiliary electrode on the auxiliary insulating layer, and overlapping with the second region of the semiconductor; a gate electrode on the auxiliary insulating layer, and overlapping with the channel of the semiconductor; a first electrode on the first auxiliary electrode, and connected to the first region of the semiconductor; and a second electrode on the second auxiliary electrode, and connected to the second region of the semiconductor.

In an embodiment, the gate electrode, the first electrode, and the second electrode may be at the same layer as each other.

In an embodiment, the first electrode may be in contact with a side surface of the first region of the semiconductor; and the second electrode may be in contact with a side surface of the second region of the semiconductor.

In an embodiment: the first auxiliary electrode may include an inner side surface and an outer side surface, the inner side surface of the first auxiliary electrode being more adjacent to the channel of the semiconductor compared with the outer side surface of the first auxiliary electrode; the second auxiliary electrode may include an inner side surface and an outer side surface, the inner side surface of the second auxiliary electrode being more adjacent to the channel of the semiconductor compared with the outer side surface of the second auxiliary electrode; the auxiliary insulating layer may be located between the first region of the semiconductor and the first auxiliary electrode, and between the second region of the semiconductor and the second auxiliary electrode; the auxiliary insulating layer may include an inner side surface and an outer side surface, the inner side surface of the auxiliary insulating layer being more adjacent to the channel of the semiconductor compared with the outer side surface of the auxiliary insulating layer; the first electrode may continuously cover an upper surface and the outer side surface of the first auxiliary electrode, and the outer side surface of the auxiliary insulating layer; and the second electrode may continuously cover an upper surface and the outer side surface of the second auxiliary electrode, and the outer side surface of the auxiliary insulating layer.

In an embodiment: the first electrode may continuously cover the inner side surface of the first auxiliary electrode and the inner side surface of the auxiliary insulating layer; and the second electrode may continuously cover the inner side surface of the second auxiliary electrode and the inner side surface of the auxiliary insulating layer.

In an embodiment: the auxiliary insulating layer may include a first opening overlapping with a portion of the first region, and a second opening overlapping with a portion of the second region; the first electrode may be in contact with an upper surface of the first region of the semiconductor within the first opening; and the second electrode may be in contact with an upper surface of the second region of the semiconductor within the second opening.

In an embodiment, the display device may further include: a driving voltage line and a light blocking pattern spaced from each other on the substrate; and a buffer layer on the driving voltage line and the light blocking pattern. The semiconductor may be on the buffer layer.

In an embodiment, the buffer layer may include: a third opening overlapping with the driving voltage line and the first electrode; and a fourth opening overlapping with the light blocking pattern and the second electrode, and the first electrode may be connected to the driving voltage line through the third opening, and the second electrode may be connected to the light blocking pattern through the fourth opening.

In an embodiment, the display device may further include: a first storage electrode located at the same layer as that of the driving voltage line and the light blocking pattern; a dummy semiconductor overlapping with the first storage electrode, and located at the same layer as that of the semiconductor; an auxiliary storage electrode overlapping with the first storage electrode, and located at the same layer as that of the first auxiliary electrode and the second auxiliary electrode; and a second storage electrode overlapping with the auxiliary storage electrode, and located at the same layer as the gate electrode, the first electrode, and the second electrode.

In an embodiment, the display device may further include a first insulating layer between the auxiliary insulating layer and the gate electrode. The first insulating layer may be further between the auxiliary storage electrode and the second storage electrode; the auxiliary insulating layer may be further between the dummy semiconductor and the auxiliary storage electrode; and the buffer layer may be further between the first storage electrode and the dummy semiconductor.

According to one or more embodiments of the present disclosure, a manufacturing method of a display device, includes: sequentially depositing a semiconductor material layer, an auxiliary insulating material layer, and an auxiliary conductive material layer on a substrate; patterning the semiconductor material layer, the auxiliary insulating material layer, and the auxiliary conductive material layer to form a semiconductor including a channel, a first region, and a second region, an auxiliary insulating layer, a first auxiliary electrode, and a second auxiliary electrode; and forming a gate electrode overlapping with the channel of the semiconductor, a first electrode connected to the first region of the semiconductor, and a second electrode connected to the second region of the semiconductor. During the patterning of the auxiliary conductive material layer, an upper surface of the semiconductor is covered by the auxiliary insulating material layer.

In an embodiment, the gate electrode, the first electrode, and the second electrode may be located at the same layer as each other.

In an embodiment: the first electrode may be in contact with a side surface of the first region of the semiconductor; and the second electrode may be in contact with a side surface of the second region of the semiconductor.

In an embodiment: the first auxiliary electrode may include an inner side surface and an outer side surface, the inner side surface of the first auxiliary electrode being more adjacent to the channel of the semiconductor compared with the outer side surface of the first auxiliary electrode; the second auxiliary electrode may include an inner side surface and an outer side surface, the inner side surface of the second auxiliary electrode being more adjacent to the channel of the semiconductor compared with the outer side surface of the second auxiliary electrode; the auxiliary insulating layer may be located between the first region of the semiconductor and the first auxiliary electrode, and between the second region of the semiconductor and the second auxiliary electrode; the auxiliary insulating layer may include an inner side surface and an outer side surface, the inner side surface of the auxiliary insulating layer being more adjacent to the channel of the semiconductor compared with the outer side surface of the auxiliary insulating layer; the first electrode may continuously cover an upper surface and the outer side surface of the first auxiliary electrode, and the outer side surface of the auxiliary insulating layer; and the second electrode may continuously cover an upper surface and the side outer surface of the second auxiliary electrode, and the outer side surface of the auxiliary insulating layer.

In an embodiment: the first electrode may continuously cover the inner side surface of the first auxiliary electrode and the inner side surface of the auxiliary insulating layer; and the second electrode may continuously cover the inner side surface of the second auxiliary electrode and the inner side surface of the auxiliary insulating layer.

In an embodiment, the manufacturing method may further include: forming a first opening and a second opening in the auxiliary insulating layer, the first opening overlapping with a portion of the first region, and the second opening overlapping with a portion of the second region; and doping the first region and the second region. The first electrode may be in contact with an upper surface of the first region of the semiconductor within the first opening, and the second electrode may be in contact with an upper surface of the second region of the semiconductor within the second opening.

In an embodiment, the manufacturing method may further include: forming a driving voltage line and a light blocking pattern on the substrate; and forming a buffer layer on the driving voltage line and the light blocking pattern. The semiconductor material layer, the auxiliary insulating material layer, and the auxiliary conductive material layer may be sequentially deposited on the buffer layer.

In an embodiment, the manufacturing method may further include forming in the buffer layer, a third opening overlapping with the driving voltage line, and a fourth opening overlapping the light blocking pattern. The first electrode may be connected to the driving voltage line through the third opening, and the second electrode may be connected to the light blocking pattern through the fourth opening.

In an embodiment: in the forming of the driving voltage line and the light blocking pattern, a first storage electrode may be further formed; in the forming of the semiconductor, a dummy semiconductor overlapping with the first storage electrode may be further formed; in the forming of the first auxiliary electrode and the second auxiliary electrode, an auxiliary storage electrode overlapping with the first storage electrode may be further formed; and in the forming of the gate electrode, the first electrode, and the second electrode, a second storage electrode overlapping with the auxiliary storage electrode may be further formed.

In an embodiment, the manufacturing method may further include forming a first insulating layer on the auxiliary insulating layer and the auxiliary storage electrode, and the gate electrode and the second storage electrode may be located on the first insulating layer.

According to one or more embodiments of the present disclosure, a defect may be prevented or substantially prevented from occurring in a transistor by preventing or substantially preventing a metal material from remaining on a channel of a semiconductor in a process of manufacturing a display device.

BRIEF DESCRIPTION OF THE DRAWINGS

The above and other aspects and features of the present disclosure will be more clearly understood from the following detailed description of the illustrative, non-limiting embodiments with reference to the accompanying drawings.

DETAILED DESCRIPTION

Figure 1:
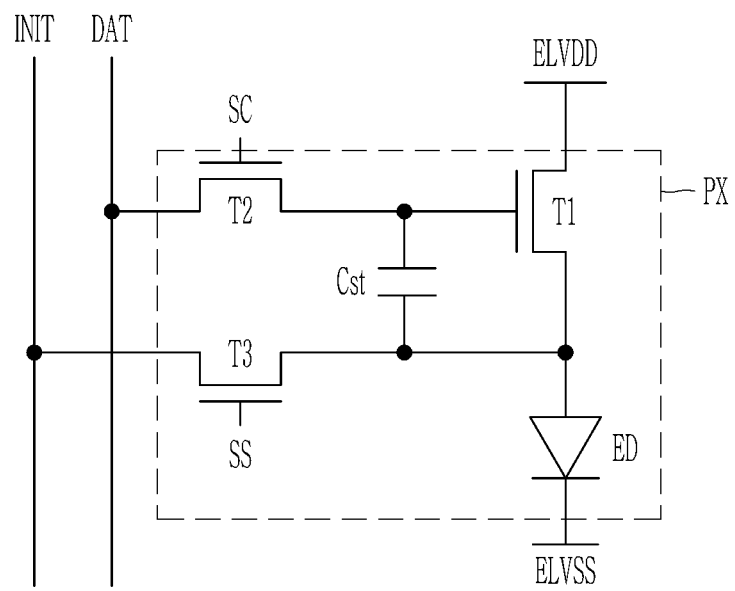
FIG. 1 illustrates a circuit diagram of one pixel of a display device according to an embodiment.

Hereinafter, embodiments will be described in more detail with reference to the accompanying drawings, in which like reference numbers refer to like elements throughout. The present disclosure, however, may be embodied in various different forms, and should not be construed as being limited to only the illustrated embodiments herein. Rather, these embodiments are provided as examples so that this disclosure will be thorough and complete, and will fully convey the aspects and features of the present disclosure to those skilled in the art. Accordingly, processes, elements, and techniques that are not necessary to those having ordinary skill in the art for a complete understanding of the aspects and features of the present disclosure may not be described. Unless otherwise noted, like reference numerals denote like elements throughout the attached drawings and the written description, and thus, redundant description thereof may not be repeated.

When a certain embodiment may be implemented differently, a specific process order may be different from the described order. For example, two consecutively described processes may be performed at the same or substantially at the same time, or may be performed in an order opposite to the described order.

In the drawings, the relative sizes and thicknesses of elements, layers, and regions may be exaggerated and/or simplified for clarity. Spatially relative terms, such as "beneath," "below," "lower," "under," "above," "upper," and the like, may be used herein for ease of explanation to describe one element or feature's relationship to another element(s) or feature(s) as illustrated in the figures. Further, as used in the specification, the term "on" or "above" may mean positioned on or below the object portion, and does not necessarily mean positioned on an upper side of the object portion based on a gravitational direction. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

As used herein, the phrase "in a plan view" or "on a plane" may refer to a view of a target portion from the top, and the phrase "in a cross-sectional view" or "on a cross-section" may refer to a view of a cross-section formed by vertically cutting a target portion from the side.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

It will be understood that when an element or layer is referred to as being "on," "connected to," or "coupled to" another element or layer, it can be directly on, connected to, or coupled to the other element or layer, or one or more intervening elements or layers may be present. Similarly, when a layer, an area, or an element is referred to as being "electrically connected" to another layer, area, or element, it may be directly electrically connected to the other layer, area, or element, and/or may be indirectly electrically connected with one or more intervening layers, areas, or elements therebetween. In addition, it will also be understood that when an element or layer is referred to as being "between" two elements or layers, it can be the only element or layer between the two elements or layers, or one or more intervening elements or layers may also be present.

The terminology used herein is for the purpose of describing particular embodiments and is not intended to be limiting of the present disclosure. As used herein, the singular forms "a" and "an" are intended to include the plural forms as well, unless the context clearly indicates otherwise. It will be further understood that the terms "comprises," "comprising," "includes," "including," "has," "have," and "having," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. For example, the expression "A and/or B" denotes A, B, or A and B. Expressions such as "at least one of," when preceding a list of elements, modify the entire list of elements and do not modify the individual elements of the list. For example, the expression "at least one of a, b, or c," "at least one of a, b, and c," and "at least one selected from the group consisting of a, b, and c" indicates only a, only b, only c, both a and b, both a and c, both b and c, all of a, b, and c, or variations thereof.

As used herein, the term "substantially," "about," and similar terms are used as terms of approximation and not as terms of degree, and are intended to account for the inherent variations in measured or calculated values that would be recognized by those of ordinary skill in the art. Further, the use of "may" when describing embodiments of the present disclosure refers to "one or more embodiments of the present disclosure." As used herein, the terms "use," "using," and "used" may be considered synonymous with the terms "utilize," "utilizing," and "utilized," respectively. Also, the term "exemplary" is intended to refer to an example or illustration.

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

First, a display device according to an embodiment will be described with reference to FIG. 1.

FIG. 1 illustrates a circuit diagram of one pixel of a display device according to an embodiment.

According to an embodiment, a display device includes a plurality of pixels PX. As shown in FIG. 1, each of the plurality of pixels PX may include a plurality of transistors T1, T2, and T3, a capacitor Cst, and at least one light emitting diode ED as a light emitting element. For convenience, an example in which one pixel PX includes one light emitting diode ED according to an embodiment will be mainly described in more detail.

The plurality of transistors T1, T2, and T3 include a driving transistor T1, a switching transistor T2, and an initializing transistor T3. A first electrode and a second electrode described in more detail below may be positioned at respective sides (e.g., opposite sides) of a channel of each of the transistors T1, T2, and T3, and may be a source electrode and a drain electrode of each of the transistors T1, T2, and T3.

A gate electrode of the driving transistor T1 is connected to one end of the capacitor Cst, a first electrode of the driving transistor T1 is connected to a driving voltage line that transmits a driving voltage ELVDD, and a second electrode of the driving transistor T1 is connected to an anode of the light emitting diode ED and another end of the capacitor Cst. The driving transistor T1 may receive a data voltage DAT according to a switching operation of the switching transistor T2, and may supply a driving current to the light emitting diode ED according to a voltage stored in the capacitor Cst.

A gate electrode of the switching transistor T2 is connected to a first scan line for transmitting a first scan signal SC, a first electrode of the switching transistor T2 is connected to a data line capable of transmitting the data voltage DAT or a reference voltage, and a second electrode of the switching transistor T2 is connected to the one end of the capacitor Cst and the gate electrode of the driving transistor T1. The switching transistor T2 is turned on according to the first scan signal SC to transmit the reference voltage or data voltage DAT to the gate electrode of the driving transistor T1 and the one end of the capacitor Cst.

A gate electrode of the initializing transistor T3 is connected to a second scan line for transmitting a second scan signal SS. A first electrode of the initializing transistor T3 is connected to the other end of the capacitor Cst, the second electrode of the driving transistor T1, and the anode of the light emitting diode ED. A second electrode of the initializing transistor T3 is connected to an initializing voltage line for transmitting an initializing voltage INIT. The initializing transistor T3 may be turned on according to the second scan signal SS to transmit the initialization voltage INIT to the anode of the light emitting diode ED and the other end of the capacitor Cst to initialize a voltage of the anode of the light emitting diode ED.

The one end of the capacitor Cst is connected to the gate electrode of the driving transistor T1 and the second electrode of the switching transistor T2, and the other end of the capacitor Cst is connected to the first electrode of the initializing transistor T3 and the anode of the light emitting diode ED. A cathode of the light emitting diode ED is connected to a common voltage line for transmitting a common voltage ELVSS.

The light emitting diode ED may emit light having a desired luminance according to a driving current generated by the driving transistor T1.

The structure of the pixel of the display device according to the embodiment described above is provided as an example, and the number of transistors, light emitting diodes, capacitors, and the like included in one pixel may be variously modified as needed or desired, and their connection relationships may also be variously modified as needed or desired.

An example of an operation of the circuit shown in FIG. 1, particularly, an example of an operation thereof during one frame, will be described in more detail. For convenience, a case in which the transistors T1, T2, and T3 are N-type channel transistors will be described in more detail as an example, but the present disclosure is not limited thereto.

When one frame starts, the first scan signal SC of a high level and the second scan signal SS of a high level are supplied in an initializing period, and the switching transistor T2 and the initializing transistor T3 are turned on. A reference voltage from the data line is supplied to the gate electrode of the driving transistor T1 and the one end of the capacitor Cst through the turned-on switching transistor T2, and the initializing voltage INIT is supplied to the second electrode of the driving transistor T1 and the anode of the light emitting diode ED through the turned-on initializing transistor T3. Accordingly, during the initializing period, the second electrode of the driving transistor T1 and the anode of the light emitting diode ED are initialized with the initializing voltage INIT. In this case, a difference voltage between the reference voltage and the initializing voltage INIT is stored in the capacitor Cst.

Next, when the second scan signal SS becomes a low level in a state in which the first scan signal SC of the high level is maintained or substantially maintained in a sensing period, the switching transistor T2 maintains the turned-on state, and the initializing transistor T3 is turned off. The gate electrode of the driving transistor T1 and the one end of the capacitor Cst are maintained or substantially maintained at the reference voltage through the turned-on switching transistor T2, and the second electrode of the driving transistor T1 and the anode of the light emitting diode ED are disconnected from the initializing voltage INIT through the turned-off initializing transistor T3. Accordingly, the driving transistor T1 is turned off when a current flows from the first electrode thereof to the second electrode thereof, and then the voltage of the second electrode thereof corresponds to (e.g., becomes) a difference between a reference voltage and a threshold voltage Vth (e.g. (reference voltage-Vth)). Here, Vth represents the threshold voltage of the driving transistor T1. In this case, the voltage difference between the gate electrode and the second electrode of the driving transistor T1 is stored in the capacitor Cst, and sensing of the threshold voltage (Vth) of the driving transistor T1 is completed. By generating a compensated data signal by reflecting characteristic information sensed during the sensing period, it may be possible to externally compensate for a characteristic deviation of the driving transistor T1, which may be different for each pixel.

Next, in a data input period, when the first scan signal SC of the high level is supplied and the second scan signal SS of the low level is supplied, the switching transistor T2 is turned on and the initializing transistor T3 is turned off. The data voltage DAT from the data line is supplied to the gate electrode of the driving transistor T1 and the one end of the capacitor Cst through the turned-on switching transistor T2. In this case, the second electrode of the driving transistor T1 and the anode of the light emitting diode ED may maintain or substantially maintain the potential of the sensing period by the turned-off driving transistor T1.

Next, the driving transistor T1 is turned on by the data voltage DAT transmitted to the gate electrode thereof in a light emitting period to generate a driving current according to the data voltage DAT, and the light emitting diode ED may emit light according to (e.g., based on) the driving current.

Hereinafter, a cross-sectional structure of a display device according to an embodiment will be described with reference to FIG. 2 together with FIG. 1.

Figure 2:
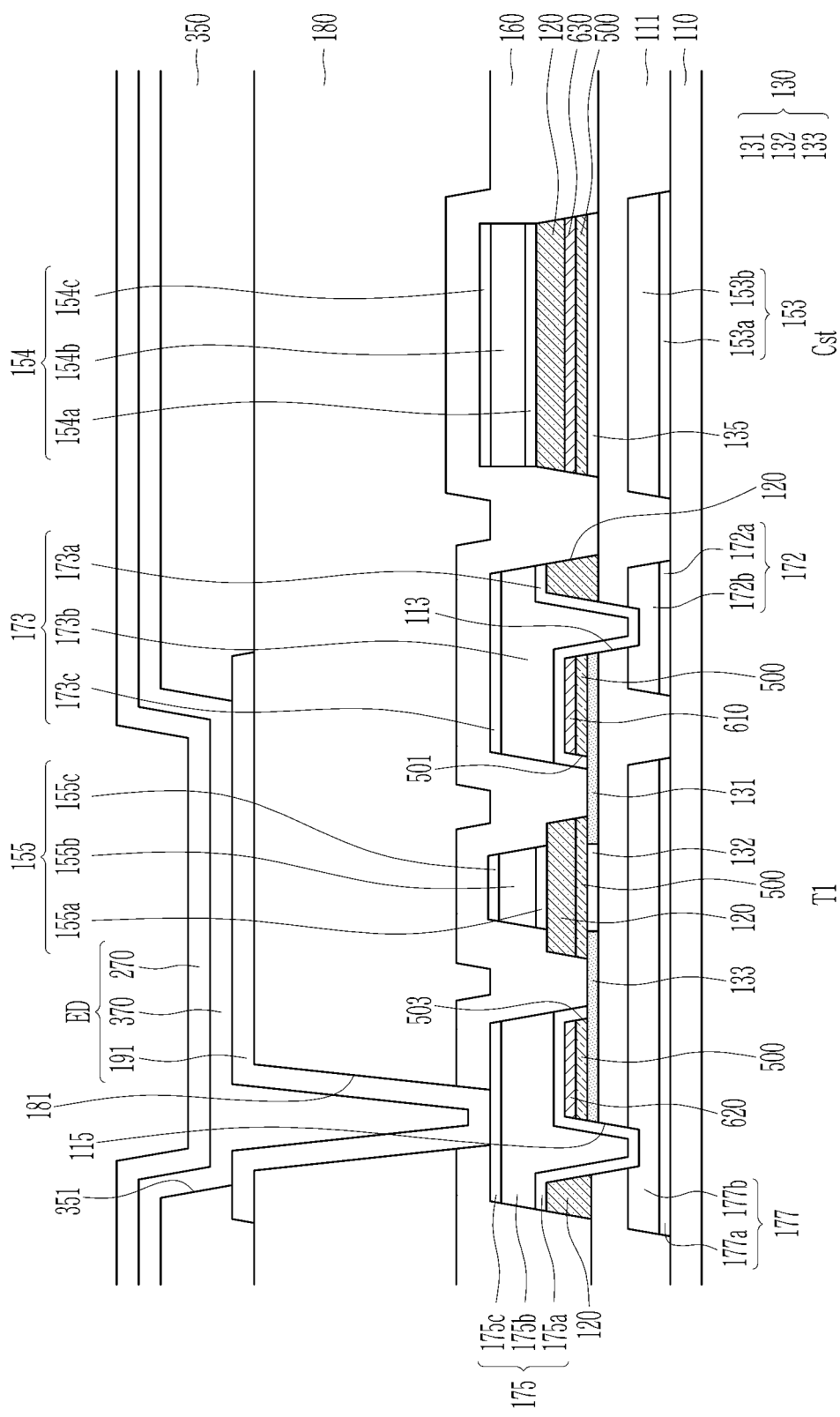
FIG. 2 illustrates a cross-sectional view of a display device according to an embodiment.

FIG. 2 illustrates a cross-sectional view of a display device according to an embodiment. FIG. 2 illustrates one of the transistors and a capacitor included in one pixel of a display device according to an embodiment. For example, the transistor illustrated in FIG. 2 may be the driving transistor. The switching transistor and the initializing transistor may have a cross-sectional structure that is the same or substantially the same as (or similar to) that of the driving transistor, and thus, redundant description thereof may not be repeated.

As shown in FIG. 2, the display device according to an embodiment may include a substrate 110. The substrate 110 may include an insulation material, such as glass, plastic, or the like, and may have a flexibility.

A first conductive layer including a light blocking pattern 177, a driving voltage line 172, and a first storage electrode 153 may be positioned on the substrate 110. The first conductive layer may be directly positioned on the substrate 110. However, the present disclosure is not limited thereto, and an insulating layer may be positioned between the substrate 110 and the first conductive layer. The first conductive layer may include a metal material, and may be formed as a single layer or multilayers. Although the first conductive layer is illustrated as a double layer in FIG. 2, the present disclosure is not limited thereto. In other embodiments, the first conductive layer may be formed as a single layer, a triple layer, or the like.

The light blocking pattern 177 may have a structure in which a lower light blocking pattern 177a and an upper light blocking pattern 177b are stacked. The upper light blocking pattern 177b may be positioned directly on the lower light blocking pattern 177a. The upper light blocking pattern 177b and the lower light blocking pattern 177a may have the same or substantially the same planar shape as each other. The light blocking pattern 177 may be electrically connected to the first electrode of the initializing transistor T3 and the other end of the capacitor Cst.

The driving voltage line 172 may be positioned to be spaced apart from the light blocking pattern 177. The driving voltage line 172 may have a structure in which a lower driving voltage line 172a and an upper driving voltage line 172b are stacked. The upper driving voltage line 172b may be positioned directly on the lower driving voltage line 172a. The upper driving voltage line 172b and the lower driving voltage line 172a may have the same or substantially the same planar shape as each other. The driving voltage ELVDD may be applied to the driving voltage line 172. The driving voltage line 172 may be connected to a plurality of pixels, and may transmit the same or substantially the same driving voltage ELVDD to each of the plurality of pixels.

The first storage electrode 153 may be positioned to be spaced apart from the driving voltage line 172. The first storage electrode 153 may be formed to have a structure in which a lower first storage electrode 153a and an upper first storage electrode 153b are stacked. The upper first storage electrode 153b may be positioned directly on the lower first storage electrode 153a. The upper first storage electrode 153b and the lower first storage electrode 153a may have the same or substantially the same planar shape as each other. The first storage electrode 153 may be electrically connected to the second electrode of the driving transistor T1 and the first electrode of the initializing transistor T3.

The first conductive layer may further include a data line, an initializing voltage line, a common voltage line, and the like. The data line, the initializing voltage line, and the common voltage line may extend in parallel with or substantially in parallel with the driving voltage line 172 in one direction.

A buffer layer 111, which is an insulating layer, may be positioned on the first conductive layer including the light blocking pattern 177, the driving voltage line 172, and the first storage electrode 153. The buffer layer 111 may also be positioned on the substrate 110. A portion of the buffer layer 111 may be positioned directly on the substrate 110, and another portion thereof may be formed to cover an upper surface and a side surface of the first conductive layer. The buffer layer 111 may include an insulating material, and may be formed as a single layer or multilayers.

A semiconductor layer including a semiconductor 130 of the driving transistor T1 may be positioned on the buffer layer 111. The semiconductor layer may be positioned directly on the buffer layer 111. However, the present disclosure is not limited thereto, and another insulating layer may be further positioned between the buffer layer 111 and the semiconductor layer. The buffer layer 111 may be positioned between the first conductive layer and the semiconductor layer. The semiconductor layer may include a semiconductor material, such as amorphous silicon, polysilicon, or an oxide semiconductor.

The semiconductor 130 of the driving transistor T1 may include a first region 131, a channel 132, and a second region 133. The first region 131, the channel 132, and the second region 133 configuring the semiconductor 130 of the driving transistor T1 may be connected to each other to be integrally formed. The channel 132 may be positioned between the first region 131 and the second region 133. The first region 131 and the second region 133 may be at least partially doped to have the same or substantially the same characteristics as a conductor.

The semiconductor layer may further include a dummy semiconductor 135. The dummy semiconductor 135 may overlap with the first storage electrode 153.

An auxiliary insulating layer 500 may be positioned on the semiconductor layer including the semiconductor 130 of the driving transistor T1 and the dummy semiconductor 135. The auxiliary insulating layer 500 may be positioned directly on the semiconductor layer. The auxiliary insulating layer 500 may cover the upper surface of the semiconductor layer, and may not cover the side surface thereof. The auxiliary insulating layer 500 may be in contact with the semiconductor layer, and may not be in contact with the buffer layer 111. The auxiliary insulating layer 500 may include an insulating material, and may be formed as a single layer or multilayers.

The auxiliary insulating layer 500 may cover an entirety of the upper surface of the dummy semiconductor 135. The auxiliary insulating layer 500 may cover a portion of the upper surface of the semiconductor 130, and may not cover another portion of the upper surface of the semiconductor 130. The auxiliary insulating layer 500 may include openings 501 and 503 that at least partially overlap with the first region 131 and the second region 133 of the semiconductor 130. At least a portion of the first region 131 of the semiconductor 130 may not be covered by the auxiliary insulating layer 500 due to the opening 501. The portion of the first region 131 that overlaps with the opening 501 is doped. Some or all of the first region 131 that does not overlap with the opening 501 may be doped. At least a portion of the second region 133 of the semiconductor 130 may not be covered by the auxiliary insulating layer 500 due to the opening 503. The portion of the second region 133 that overlaps with the opening 503 is doped. Some or all of the second region 133 that does not overlap with the opening 503 may be doped.

An auxiliary conductive layer including a first auxiliary electrode 610, a second auxiliary electrode 620, and an auxiliary storage electrode 630 may be positioned on the auxiliary insulating layer 500. The auxiliary conductive layer may be positioned directly on the auxiliary insulating layer 500. However, the present disclosure is not limited thereto, and another insulating layer may be further positioned between the auxiliary insulating layer 500 and the auxiliary conductive layer. The auxiliary insulating layer 500 may be positioned between the semiconductor layer and the auxiliary conductive layer. The auxiliary conductive layer may include a metal material, and may be formed as a single layer or multilayers.

The first auxiliary electrode 610 may overlap with a portion of the first region 131 of the semiconductor 130. The auxiliary insulating layer 500 may be positioned between the first region 131 of the semiconductor 130 and the first auxiliary electrode 610.

The second auxiliary electrode 620 may overlap with a portion of the second region 133 of the semiconductor 130. The auxiliary insulating layer 500 may be positioned between the second region 133 of the semiconductor 130 and the second auxiliary electrode 620.

The auxiliary conductive layer may not overlap with the channel 132 of the semiconductor 130. However, the present disclosure is not limited thereto, and in some embodiments, the auxiliary conductive layer may further include a portion overlapping with the channel 132 of the semiconductor 130.

The auxiliary storage electrode 630 may overlap with the dummy semiconductor 135. In addition, the auxiliary storage electrode 630 may overlap with the first storage electrode 153. The auxiliary storage electrode 630 may be electrically connected to the gate electrode of the driving transistor T1 and the second electrode of the switching transistor T2.

A first insulating layer 120 may be positioned on at least a portion of the auxiliary conductive layer. The first insulating layer 120 may include an insulating material, and may be formed as a single layer or multilayers. The first insulating layer 120 may be positioned on the auxiliary storage electrode 630, and may not be positioned on the first auxiliary electrode 610 and the second auxiliary electrode 620. The first insulating layer 120 may be positioned directly on the auxiliary storage electrode 630. The first insulating layer 120 may cover the upper surface of the auxiliary storage electrode 630, and may not cover the side surface thereof. The auxiliary storage electrode 630 may be positioned between the first insulating layer 120 and the auxiliary insulating layer 500.

The first insulating layer 120 may be positioned on the auxiliary insulating layer 500. The first insulating layer 120 may overlap with the channel 132 of the semiconductor 130. A portion of the first insulating layer 120 overlapping with the channel 132 of the semiconductor 130 may be positioned directly on the auxiliary insulating layer 500. In this case, the first insulating layer 120 may cover the upper surface of the auxiliary insulating layer 500, and may not cover the side surface thereof.

The first insulating layer 120 may be positioned on the buffer layer 111. The first insulating layer 120 may at least partially overlap with the light blocking pattern 177 and the driving voltage line 172. A portion of the first insulating layer 120 overlapping with the light blocking pattern 177 may be positioned directly on the buffer layer 111. A portion of the first insulating layer 120 overlapping with the driving voltage line 172 may be positioned directly on the buffer layer 111.

A second conductive layer including a gate electrode 155, a first electrode 173, a second electrode 175, and a second storage electrode 154 may be positioned on the first insulating layer 120. At least a portion of the second conductive layer may be positioned directly on the first insulating layer 120. However, the present disclosure is not limited thereto, and another insulating layer may be further positioned between the first insulating layer 120 and the second conductive layer. The second conductive layer may include a metal material, and may be formed of a single layer or multilayers. Although the second conductive layer is illustrated as a triple layer in FIG. 2, the present disclosure is not limited thereto. The second conductive layer may be formed as a single layer, a double layer, or the like.

The gate electrode 155 may overlap with the channel 132 of the semiconductor 130. The auxiliary insulating layer 500 and the first insulating layer 120 may be positioned between the gate electrode 155 and the channel 132 of the semiconductor 130. The gate electrode 155 may include a lower gate electrode 155a, an intermediate gate electrode 155b, and an upper gate electrode 155c. The intermediate gate electrode 155b may be positioned between the lower gate electrode 155a and the upper gate electrode 155c. The lower gate electrode 155a, the intermediate gate electrode 155b, and the upper gate electrode 155c may have the same or substantially the same planar shape as each other. The gate electrode 155 of the driving transistor T1 may be connected to the one end of the capacitor Cst and the second electrode of the switching transistor T2.

The first electrode 173 may overlap with at least a portion of the first region 131 of the semiconductor 130. The auxiliary insulating layer 500 and the first auxiliary electrode 610 may be positioned between the first electrode 173 and the first region 131 of the semiconductor 130. The first electrode 173 may include a lower first electrode 173a, an intermediate first electrode 173b, and an upper first electrode 173c. The intermediate first electrode 173b may be positioned between the lower first electrode 173a and the upper first electrode 173c. The lower first electrode 173a, the intermediate first electrode 173b, and the upper first electrode 173c may have the same or substantially the same planar shape as each other.

The lower first electrode 173a may be in contact with the upper surface and the side surface of the first auxiliary electrode 610. In addition, the lower first electrode 173a may be in contact with the side surface of the auxiliary insulating layer 500 positioned under (e.g., underneath) the first auxiliary electrode 610. The lower first electrode 173a may be in contact with an upper surface, an inner surface (e.g., an inner side surface), and an outer surface (e.g., an outer side surface) of the first auxiliary electrode 610, and may be in contact with an inner surface (e.g., an inner side surface) and an outer surface (e.g., an outer side surface) of the auxiliary insulating layer 500. The inner surface of the first auxiliary electrode 610 refers to a side surface thereof that is relatively adjacent to the channel 132 of the semiconductor 130, and the outer surface of the first auxiliary electrode 610 refers to a side surface thereof that is relatively farther from the channel 132 of the semiconductor 130. The inner surface of the auxiliary insulating layer 500 refers to a side surface thereof that is relatively adjacent to the channel 132 of the semiconductor 130, and the outer surface of the auxiliary insulating layer 500 refers to a side surface thereof that is relatively farther from the channel 132 of the semiconductor 130. The inner surface of the first auxiliary electrode 610 and the inner surface of the auxiliary insulating layer 500 may coincide with one edge of the opening 501 of the auxiliary insulating layer 500. The lower first electrode 173a may continuously cover the inner surface of the auxiliary insulating layer 500 and the inner surface of the first auxiliary electrode 610. In addition, the lower first electrode 173a may continuously cover the outer surface of the auxiliary insulating layer 500 and the outer surface of the first auxiliary electrode 610.

In addition, the lower first electrode 173a may contact the upper surface and the side surface of the first region 131 of the semiconductor 130. At least a portion of the first region 131 of the semiconductor 130 overlaps with (e.g., may be exposed by) the opening 501, and may not be covered by the auxiliary insulating layer 500. The lower first electrode 173a may be connected to the first region 131 of the semiconductor 130 through the opening 501. In the opening 501, the lower first electrode 173a may be in contact with the upper surface of the first region 131 of the semiconductor 130. The lower first electrode 173a is positioned at one end within the opening 501, and is not entirely positioned in the opening 501. In other words, the first electrode 173 and the gate electrode 155 are spaced apart from each other by a suitable distance (e.g., a predetermined distance). In addition, the first electrode 173 is also spaced apart from the portion of the auxiliary insulating layer 500 positioned under (e.g., underneath) the gate electrode 155. In addition, the first electrode 173 is also spaced apart from the portion of the first insulating layer 120 positioned under (e.g., underneath) the gate electrode 155. The lower first electrode 173a may cover a side surface of an end portion of the first region 131 of the semiconductor 130. In this case, the lower first electrode 173a may contact the side surface of the end portion of the first region 131 of the semiconductor 130.

The lower first electrode 173a may continuously cover a portion of the upper surface of the first region 131 of the semiconductor 130, the inner surface of the auxiliary insulating layer 500, the inner, upper, and outer surfaces of the first auxiliary electrode 610, the outer surface of the auxiliary insulating layer 500, and the side surface of the end portion of the first region 131 of the semiconductor 130.

The buffer layer 111 may be positioned between the driving voltage line 172 and the first electrode 173 of the driving transistor T1. The buffer layer 111 may include an opening 113 overlapping with the driving voltage line 172 and the first electrode 173 of the driving transistor T1. The first electrode 173 may be positioned in the opening 113. The first electrode 173 may be connected to the driving voltage line 172 through the opening 113. In this case, the lower first electrode 173a and the upper driving voltage line 172b may contact each other in the opening 113. The first insulating layer 120 may be further positioned between the first electrode 173 and the driving voltage line 172. The first insulating layer 120 may not overlap with the auxiliary insulating layer 500 and the first auxiliary electrode 610.

The second electrode 175 may overlap with at least a portion of the second region 133 of the semiconductor 130. The auxiliary insulating layer 500 and the second auxiliary electrode 620 may be positioned between the second electrode 175 and the second region 133 of the semiconductor 130. The second electrode 175 may include a lower second electrode 175a, an intermediate second electrode 175b, and an upper second electrode 175c. The intermediate second electrode 175b may be positioned between the lower second electrode 175a and the upper second electrode 175c. The lower second electrode 175a, the intermediate second electrode 175b, and the upper second electrode 175c may have the same or substantially the same planar shape as each other.

The lower second electrode 175a may be in contact with the upper surface and the side surface of the second auxiliary electrode 620. In addition, the lower second electrode 175a may be in contact with the side surface of the auxiliary insulating layer 500 positioned under (e.g., underneath) the second auxiliary electrode 620. The lower second electrode 175a may be in contact with the upper surface, the inner surface, and the outer surface of the second auxiliary electrode 620, and may be in contact with the inner surface and the outer surface of the auxiliary insulating layer 500. The inner surface of the second auxiliary electrode 620 refers to a side surface thereof that is relatively adjacent to the channel 132 of the semiconductor 130, and the outer surface of the second auxiliary electrode 620 refers to a side surface thereof that is relatively farther from the channel 132 of the semiconductor 130. The inner surface of the auxiliary insulating layer 500 refers to a side surface thereof that is relatively adjacent to the channel 132 of the semiconductor 130, and the outer surface of the auxiliary insulating layer 500 refers to a side surface thereof that is relatively farther from the channel 132 of the semiconductor 130. The inner surface of the second auxiliary electrode 620 and the inner surface of the auxiliary insulating layer 500 may coincide with one edge of the opening 503 of the auxiliary insulating layer 500. The lower second electrode 175a may continuously cover the inner surface of the auxiliary insulating layer 500 and the inner surface of the second auxiliary electrode 620. In addition, the lower second electrode 175a may continuously cover the outer surface of the auxiliary insulating layer 500 and the outer surface of the second auxiliary electrode 620.

In addition, the lower second electrode 175a may be in contact with the upper surface and the side surface of the second region 133 of the semiconductor 130. At least a portion of the second region 133 of the semiconductor 130 overlaps with (e.g., may be exposed by) the opening 503, and may not be covered by the auxiliary insulating layer 500. The lower second electrode 175a may be connected to the second region 133 of the semiconductor 130 through the opening 503. In the opening 503, the lower second electrode 175a may be in contact with the upper surface of the second region 133 of the semiconductor 130. The lower second electrode 175a is positioned at one end portion in the opening 503, and is not entirely positioned in the opening 503. In other words, the second electrode 175 and the gate electrode 155 are spaced apart from each other by a suitable distance (e.g., a predetermined distance). In addition, the second electrode 175 is also spaced apart from the portion of the auxiliary insulating layer 500 positioned under (e.g., underneath) the gate electrode 155. In addition, the second electrode 175 is also spaced apart from the portion of the first insulating layer 120 positioned under (e.g., underneath) the gate electrode 155. The lower second electrode 175a may cover the side surface of the end portion of the second region 133 of the semiconductor 130. In this case, the lower second electrode 175a may contact the side surface of the end portion of the second region 133 of the semiconductor 130.

The lower second electrode 175a may continuously cover the upper surface of the second region 133 of the semiconductor 130, the inner surface of the auxiliary insulating layer 500, the inner, upper, and outer surfaces of the second auxiliary electrode 620, the outer surface of the auxiliary insulating layer 500, and the side surface of the end portion of the second region 133 of the semiconductor 130.

The buffer layer 111 may be positioned between the light blocking pattern 177 and the second electrode 175 of the driving transistor T1. The buffer layer 111 may include an opening 115 overlapping with the light blocking pattern 177 and the second electrode 175 of the driving transistor T1. The second electrode 175 may be positioned in the opening 115. The second electrode 175 may be connected to the light blocking pattern 177 through the opening 115. In this case, the lower second electrode 175a and the upper light blocking pattern 177b may contact each other in the opening 115. The first insulating layer 120 may be further positioned between the second electrode 175 and the light blocking pattern 177. The first insulating layer 120 may not overlap with the auxiliary insulating layer 500 and the second auxiliary electrode 620.

The second storage electrode 154 may overlap with the first storage electrode 153. The dummy semiconductor 135 and the auxiliary storage electrode 630 may be positioned between the second storage electrode 154 and the first storage electrode 153. The buffer layer 111 may be positioned between the first storage electrode 153 and the dummy semiconductor 135, and the auxiliary insulating layer 500 may be positioned between the dummy semiconductor 135 and the auxiliary storage electrode 630. The first insulating layer 120 may be positioned between the auxiliary storage electrode 630 and the second storage electrode 154. The second storage electrode 154 may include a lower second storage electrode 154a, an intermediate second storage electrode 154b, and an upper second storage electrode 154c. The intermediate second storage electrode 154b may be positioned between the lower second storage electrode 154a and the upper second storage electrode 154c. The lower second storage electrode 154a, the intermediate second storage electrode 154b, and the upper second storage electrode 154c may have the same or substantially the same planar shape as each other. The second storage electrode 154 may be electrically connected to the second electrode of the driving transistor T1 and the first electrode of the initializing transistor T3.

A second insulating layer 160 and a third insulating layer 180 may be positioned on the second conductive layer including the gate electrode 155, the first electrode 173, the second electrode 175, and the second storage electrode 154. The second insulating layer 160 and the third insulating layer 180 may include an insulating material, and may be formed as a single layer or multilayers.

At least one of the first conductive layer, the auxiliary conductive layer, and the second conductive layer may include at least one of copper (Cu), aluminum (Al), magnesium (Mg), silver (Ag), gold (Au), platinum (Pt), palladium (Pd), nickel (Ni), neodymium (Nd), iridium (Ir), molybdenum (Mo), tungsten (W), titanium (Ti), chromium (Cr), tantalum (Ta), or a suitable alloy thereof. Each of the first conductive layer, the second conductive layer, and the third conductive layer may be formed as a single layer or multilayers. For example, each of the first conductive layer, the second conductive layer, and the third conductive layer may have a multilayered structure including a lower layer containing titanium and an upper layer containing copper.

At least one of the buffer layer 111, the first insulating layer 120, the auxiliary insulating layer 500, the second insulating layer 160, and the third insulating layer 180 may include an inorganic insulating material, such as silicon nitride (SiNx), silicon oxide (SiOx), and/or silicon oxide (SiON), and/or an organic insulating material, such as polyimide, an acryl-based polymer, and/or a siloxane-based polymer.

A third conductive layer including a pixel electrode 191 may be positioned on the third insulating layer 180. The pixel electrode 191 may overlap with the second electrode 175 of the driving transistor T1. The second insulating layer 160 and the third insulating layer 180 may include an opening 181 overlapping with the pixel electrode 191 and the second electrode 175 of the driving transistor T1. The pixel electrode 191 may be connected to the second electrode 175 of the driving transistor T1 through the opening 181.

A fourth insulating layer 350 may be positioned on the third conductive layer. The fourth insulating layer 350 may include an organic insulating material, such as a polyacryl-based resin or a polyimide-based resin. The fourth insulating layer 350 may include an opening 351 overlapping with (e.g., exposing) the pixel electrode 191. The opening 351 of the fourth insulating layer 350 may overlap with a central portion of the pixel electrode 191, and may not overlap with an edge of the pixel electrode 191. In other words, an edge of the pixel electrode 191 may be covered by the fourth insulating layer 350.

A light emitting layer 370 may be positioned on the fourth insulating layer 350 and the pixel electrode 191. The light emitting layer 370 may be positioned in the opening 351 of the fourth insulating layer 350. The light emitting layer 370 may include an organic light emitting material or an inorganic light emitting material. The light emitting layer 370 is shown as being formed on an entirety of the substrate 110, but the present disclosure is not limited thereto. The light emitting layer 370 may be positioned only within the opening 351 of the fourth insulating layer 350.

A common electrode 270 may be positioned on the light emitting layer 370. The common electrode 270 may be formed on an entirety of the substrate 110. In other words, one common electrode 270 may be entirely positioned on a plurality of pixels. The common electrode 270 may be connected to the common voltage line that transmits the common voltage ELVSS.

At least one of the fourth conductive layer and the common electrode 270 may include a transparent metal oxide, such as indium tin oxide (ITO) and/or indium zinc oxide (IZO).

The pixel electrode 191, the light emitting layer 370, and the common electrode 270 together may form the light emitting diode ED. In this case, the pixel electrode 191 may be the anode, and the common electrode 270 may be the cathode.

Hereinafter, a manufacturing method of a display device according to an embodiment will be described with reference to FIG. 3 to FIG. 11.

FIGS. 3-11 illustrate cross-sectional views of sequential processes of a manufacturing method of a display device according to an embodiment.

Figure 3:
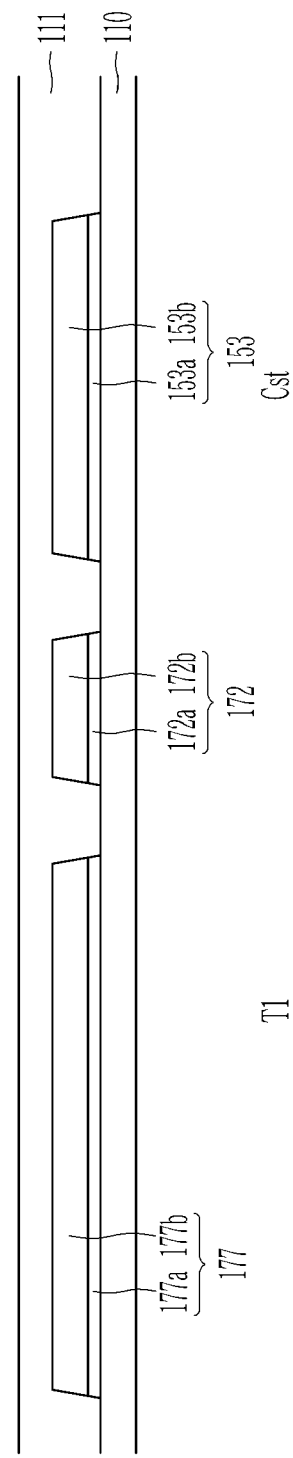
FIGS. 3-11 illustrate cross-sectional views of sequential processes of a manufacturing method of a display device according to an embodiment.

As shown in FIG. 3, a metal material, such as copper (Cu), aluminum (Al), magnesium (Mg), silver (Ag), gold (Au), platinum (Pt), palladium (Pd), nickel (Ni), neodymium (Nd), iridium (Ir), molybdenum (Mo), tungsten (W), titanium (Ti), chromium (Cr), tantalum (Ta), and/or an alloy thereof, is deposited on the substrate 110, and a photo and etching process is performed to form the first conductive layer. In this case, the first conductive layer may be formed by continuously depositing the metal material and patterning the metal material, and the first conductive layer may be formed as multilayers. For example, the first conductive layer may be formed as a double layer including a lower layer and an upper layer. However, the present disclosure is not limited thereto, and the first conductive layer may be formed as a single layer or a triple layer.

The first conductive layer may include the light blocking pattern 177, the driving voltage line 172, and the first storage electrode 153. The light blocking pattern 177 may include the lower light blocking pattern 177a and the upper light blocking pattern 177b. The driving voltage line 172 may be spaced apart from the light blocking pattern 177, and may include the lower driving voltage line 172a and the upper driving voltage line 172b. The first storage electrode 153 may be spaced apart from the driving voltage line 172, and may include the lower first storage electrode 153a and the upper first storage electrode 153b.

Next, the buffer layer 111 is formed on the substrate 110 and the first conductive layer including the light blocking pattern 177, the driving voltage line 172, and the first storage electrode 153, by using an inorganic insulating material, such as silicon nitride (SiNx), silicon oxide (SiOx), or silicon oxynitride ($SiO_xN_y$), or an organic insulating material, such as polyimide, an acryl-based polymer, or a siloxane-based polymer. The buffer layer 111 may be entirely formed on the substrate 110.

Figure 4:
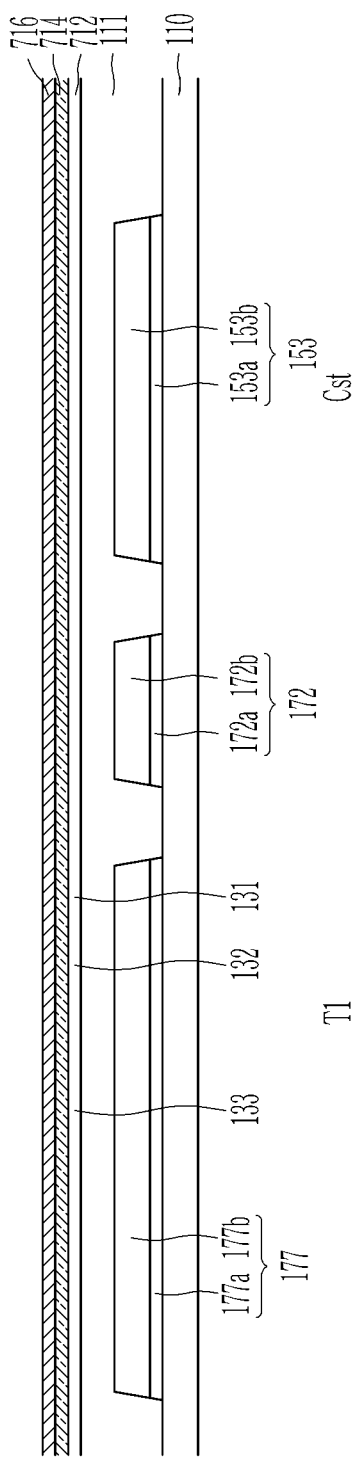

As shown in FIG. 4, a semiconductor material layer 712, an auxiliary insulating material layer 714, and an auxiliary conductive material layer 716 are sequentially deposited and formed on the buffer layer 111. The semiconductor material layer 712 may include a semiconductor material, such as amorphous silicon, polysilicon, or an oxide semiconductor. The auxiliary insulating material layer 714 may include an insulating material, and the auxiliary conductive material layer 716 may include a metal material.

Figure 5:
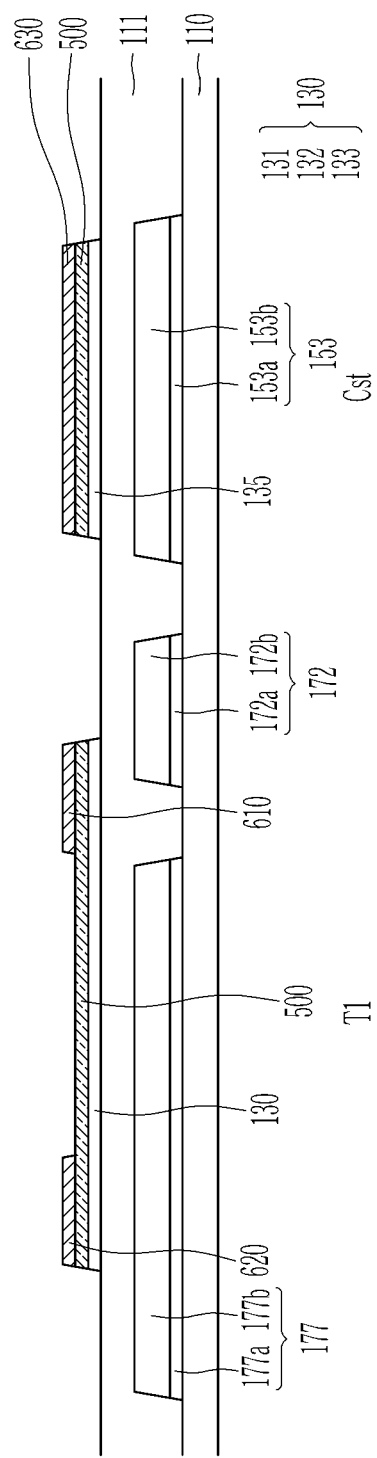

As shown in FIG. 5, the semiconductor material layer 712, the auxiliary insulating material layer 714, and the auxiliary conductive material layer 716 may be patterned by performing photo and etching processes, such that the semiconductor layer including the semiconductor 130 of the driving transistor T1 and the dummy semiconductor 135, and the auxiliary conductive layer including the auxiliary insulating layer 500, the first auxiliary electrode 610, the second auxiliary electrode 620, and the auxiliary storage electrode 630, are formed.

In this case, the semiconductor material layer 712, the auxiliary insulating material layer 714, and the auxiliary conductive material layer 716 may be patterned by using a halftone mask or a slit mask. In more detail, first, photoresist patterns having different thicknesses are formed, and the auxiliary conductive material layer 716 may be first-wet-etched by using the photoresist patterns as a mask. Subsequently, the auxiliary insulating material layer 714 and the semiconductor material layer 712 may be first-dry-etched. The semiconductor material layer 712, the auxiliary insulating material layer 714, and the auxiliary conductive material layer 716 may be patterned to have the same or substantially the same planar shape as each other.

Then, a portion of the photoresist pattern having a relatively thin thickness may be removed by ashing the photoresist pattern. The auxiliary conductive material layer 716 may be second-wet-etched by using the remaining portion of the photoresist pattern as a mask. Thereafter, the remaining portion of the photoresist pattern is removed.

After the first wet and dry etching processes and the second wet etching process, the semiconductor 130 of the driving transistor T1, the dummy semiconductor 135, the auxiliary insulating layer 500, the first auxiliary electrode 610, the second auxiliary electrode 620, and the auxiliary storage electrode 630 are formed. The semiconductor 130 of the driving transistor T1 may overlap with the light blocking pattern 177 and the driving voltage line 172, and the dummy semiconductor 135 may overlap with the first storage electrode 153. The auxiliary insulating layer 500 may be positioned on the semiconductor 130 of the driving transistor T1 and the dummy semiconductor 135. The first auxiliary electrode 610, the second auxiliary electrode 620, and the auxiliary storage electrode 630 may be positioned on the auxiliary insulating layer 500. The first auxiliary electrode 610 and the second auxiliary electrode 620 may overlap with a portion of the semiconductor 130 of the driving transistor T1. The first auxiliary electrode 610 may overlap with one edge of the semiconductor 130, and the second auxiliary electrode 620 may overlap with another edge (e.g., an opposite edge) of the semiconductor 130. The first auxiliary electrode 610 and the second auxiliary electrode 620 may be spaced apart from each other. The auxiliary storage electrode 630 may overlap with the first storage electrode 153.

While patterning the auxiliary conductive material layer 716, the upper surface of the semiconductor 130 is covered by the auxiliary insulating layer 500. In the process of patterning the auxiliary conductive material layer 716, a portion of the auxiliary conductive material layer 716 positioned between the first auxiliary electrode 610 and the second auxiliary electrode 620 is removed. Because the upper surface of the semiconductor 130 is covered by the auxiliary insulating layer 500, it may be possible to prevent or substantially prevent the metal material from remaining on the upper surface of the semiconductor 130 in the etching process of the auxiliary conductive material layer 716.

Figure 6:
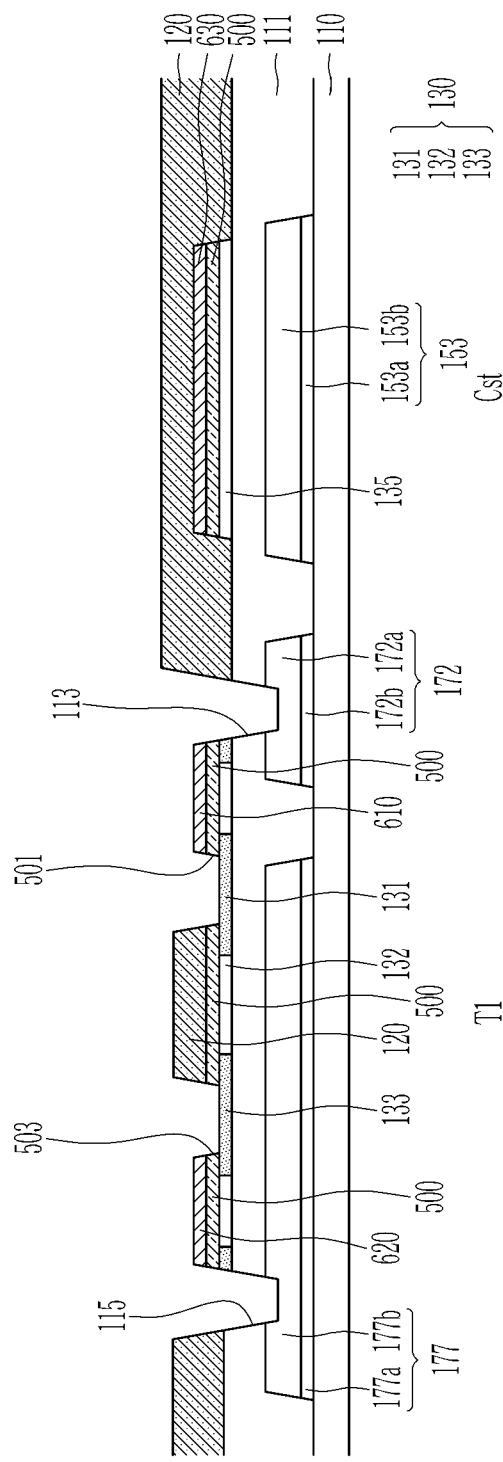

As shown in FIG. 6, an insulating material is deposited, and a photo and etching process is performed to form the first insulating layer 120. The first insulating layer 120 may overlap with some portion of the semiconductor 130, and may not overlap with some other portion thereof. The first insulating layer 120 may overlap with the channel 132 of the semiconductor 130, and may not overlap with some portions of the first region 131 and second region 133 thereof. The channel 132 of the semiconductor 130 may be positioned between the first region 131 and the second region 133 thereof. In addition, in the process of patterning the first insulating layer 120, portions of the first insulating layer 120 positioned adjacent to the first region 131 and the second region 133 of the semiconductor 130 may also be removed.

In addition, in the process of patterning the first insulating layer 120, the auxiliary insulating layer 500 and the buffer layer 111 may be patterned together. The openings 501 and 503 may be formed by removing a portion of the auxiliary insulating layer 500 that is not covered by the first insulating layer 120, the first auxiliary electrode 610, and the second auxiliary electrode 620. A portion of the upper surface of the semiconductor 130 may be exposed by the openings 501 and 503. The opening 501 may overlap with the first region 131 of the semiconductor 130, and the opening 503 may overlap with the second region 133 of the semiconductor 130. In addition, the openings 113 and 115 may be formed by removing a portion of the buffer layer 111 not covered by the first insulating layer 120 and the semiconductor 130. The opening 113 may overlap with the driving voltage line 172, and a portion of the upper surface of the driving voltage line 172 may be exposed by the opening 113. The opening 115 may overlap with the light blocking pattern 177, and a portion of the upper surface of the light blocking pattern 177 may be exposed by the opening 115.

Subsequently, a doping process or plasma treatment may be performed. The portion of the semiconductor 130 covered by the first insulating layer 120 and the auxiliary insulating layer 500 is not doped or plasma-treated, and portions of the semiconductor 130 not covered by the first insulating layer 120 and the auxiliary insulating layer 500 may be doped or plasma-treated to be able to have the same or substantially the same characteristics as a conductor. In some embodiments, portions of the semiconductor 130 covered by the first auxiliary electrode 610 and the second auxiliary electrode 620 may also not be doped or plasma-treated. The channel 132 of the semiconductor 130 is not doped or plasma-treated, and the first region 131 and the second region 133 thereof may be doped or plasma-treated. In this case, a portion of the semiconductor 130 exposed by openings 501 and 503 and the side surface of the semiconductor 130 adjacent to and exposed by the openings 113 and 115 may be doped or plasma-treated, which may spread to the surrounding area.

Figure 7:
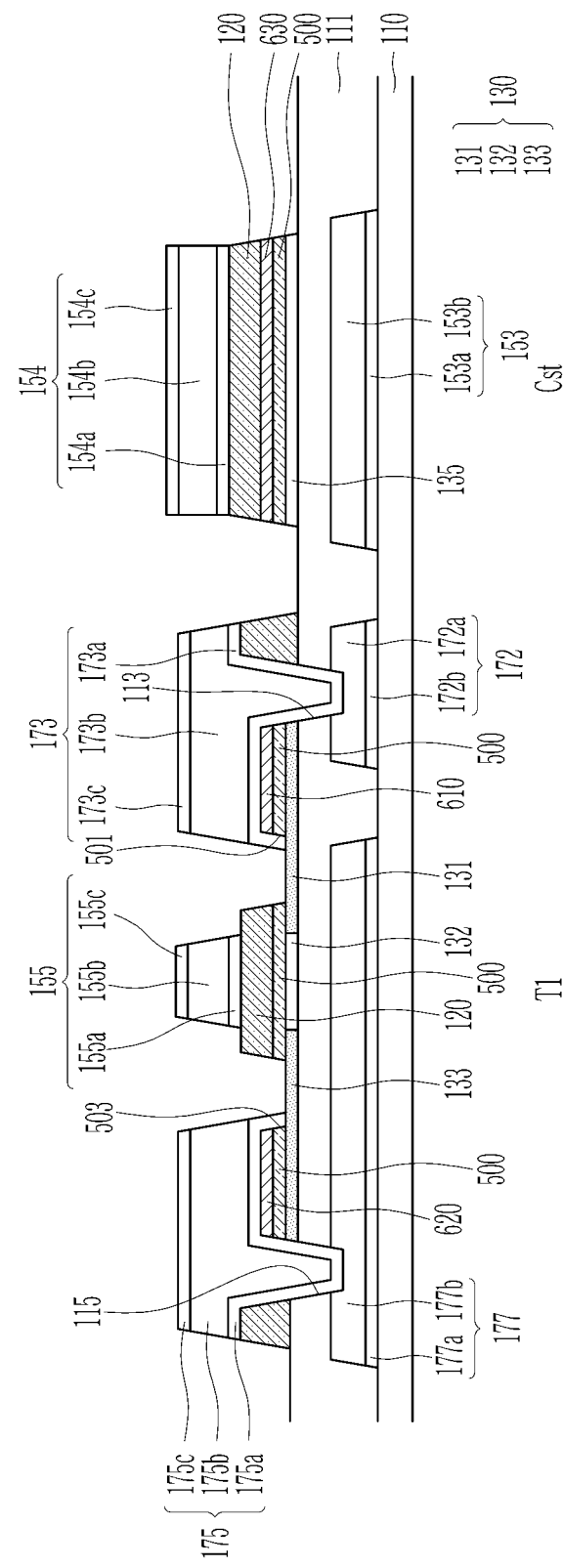

As shown in FIG. 7, a metal material is deposited on the first insulating layer 120, the first auxiliary electrode 610, and the second auxiliary electrode 620, and a photo and etching process is performed to form the second conductive layer. In this case, the second conductive layer may be formed by continuously depositing the metal material and patterning the metal material, such that the second conductive layer may be formed as multilayers. For example, the second conductive layer may be formed as a triple layer including a lower layer, an intermediate layer, and an upper layer. However, the present disclosure is not limited thereto, and the second conductive layer may be formed as a single layer or a double layer.

The second conductive layer may include the gate electrode 155, the first electrode 173, the second electrode 175, and the second storage electrode 154. The gate electrode 155 may overlap with the channel 132 of the semiconductor 130. The gate electrode 155 may include the lower gate electrode 155a, the intermediate gate electrode 155b, and the upper gate electrode 155c. The first electrode 173 may overlap with at least a portion of the first region 131 of the semiconductor 130. The first electrode 173 may include the lower first electrode 173a, the intermediate first electrode 173b, and the upper first electrode 173c. The second electrode 175 may overlap with at least a portion of the second region 133 of the semiconductor 130. The second electrode 175 may include the lower second electrode 175a, the intermediate second electrode 175b, and the upper second electrode 175c. The second storage electrode 154 may overlap with the first storage electrode 153. The second storage electrode 154 may include the lower second storage electrode 154a, the intermediate second storage electrode 154b, and the upper second storage electrode 154c.

The first electrode 173 may be in contact with the upper surface and the side surface of the first auxiliary electrode 610. In addition, the first electrode 173 may be in contact with the side surface of the auxiliary insulating layer 500 positioned under (e.g., underneath) the first auxiliary electrode 610. The first electrode 173 may be in contact with the upper surface, the inner surface, and the outer surface of the first auxiliary electrode 610, and may be in contact with the inner surface and the outer surface of the auxiliary insulating layer 500. The inner surface of the first auxiliary electrode 610 and the inner surface of the auxiliary insulating layer 500 may coincide with one edge of the opening 501 of the auxiliary insulating layer 500. The first electrode 173 may continuously cover the inner surface of the auxiliary insulating layer 500 and the inner surface of the first auxiliary electrode 610. In addition, the first electrode 173 may continuously cover the outer surface of the auxiliary insulating layer 500 and the outer surface of the first auxiliary electrode 610. In addition, the first electrode 173 may be in contact with the upper surface and the side surface of the first region 131 of the semiconductor 130. The first electrode 173 may be connected to the upper surface of the first region 131 of the semiconductor 130 through the opening 501 of the auxiliary insulating layer 500. The first electrode 173 may be connected to the side surface of the first region 131 positioned at the edge of the semiconductor 130. The first electrode 173 may continuously cover the upper surface of the first region 131 of the semiconductor 130, the inner surface of the auxiliary insulating layer 500, the inner surface, the upper surface, and the outer surface of the first auxiliary electrode 610, the outer surface of the auxiliary insulating layer 500, and the side surface of the end portion of the first region 131 of the semiconductor 130 exposed at the opening 113. In addition, the first electrode 173 may be connected to the driving voltage line 172 through the opening 113 of the buffer layer 111.

The second electrode 175 may be in contact with the upper surface and the side surface of the second auxiliary electrode 620. In addition, the second electrode 175 may be in contact with the side surface of the auxiliary insulating layer 500 positioned under (e.g., underneath) the second auxiliary electrode 620. The second electrode 175 may be in contact with the upper surface, the inner surface, and the outer surface of the second auxiliary electrode 620, and may be in contact with the inner surface and the outer surface of the auxiliary insulating layer 500. The inner surface of the second auxiliary electrode 620 and the inner surface of the auxiliary insulating layer 500 may coincide with one edge of the opening 503 of the auxiliary insulating layer 500. The second electrode 175 may continuously cover the inner surface of the auxiliary insulating layer 500 and the inner surface of the second auxiliary electrode 620. In addition, the second electrode 175 may continuously cover the outer surface of the auxiliary insulating layer 500 and the outer surface of the second auxiliary electrode 620. In addition, the second electrode 175 may be in contact with the upper surface and the side surface of the second region 133 of the semiconductor 130. The second electrode 175 may be connected to the upper surface of the second region 133 of the semiconductor 130 through the opening 503 of the auxiliary insulating layer 500. The second electrode 175 may be connected to the side surface of the second region 133 positioned at the edge of the semiconductor 130. The second electrode 175 may be continuously cover the upper surface of the second region 133 of the semiconductor 130, the inner surface of the auxiliary insulating layer 500, the inner surface, the upper surface, and the outer surface of the second auxiliary electrode 620, the outer surface of the auxiliary insulating layer 500, and the side surface of the end portion of the second region 133 of the semiconductor 130 exposed at the opening 115. In addition, the second electrode 175 may be connected to the light blocking pattern 177 through the opening 115 of the buffer layer 111.

Then, a dry etching process may be performed to remove a portion of the first insulating layer 120 not covered by the second conductive layer. In this case, the portion of the first insulating layer 120 not covered by the second conductive layer may not be entirely removed, but some thereof may remain. During the dry etching process, doped regions in the first region 131 and the second region 133 may be diffused. Accordingly, the first region 131 and the second region 133 may be uniformly doped as a whole. However, even if the first region 131 and the second region 133 are not uniformly doped as a whole, the first electrode 173 and the second electrode 175 are in contact with the upper surfaces of the first region 131 and the second region 133, respectively, of the semiconductor 130, so that they may be electrically smoothly connected.

Figure 8:
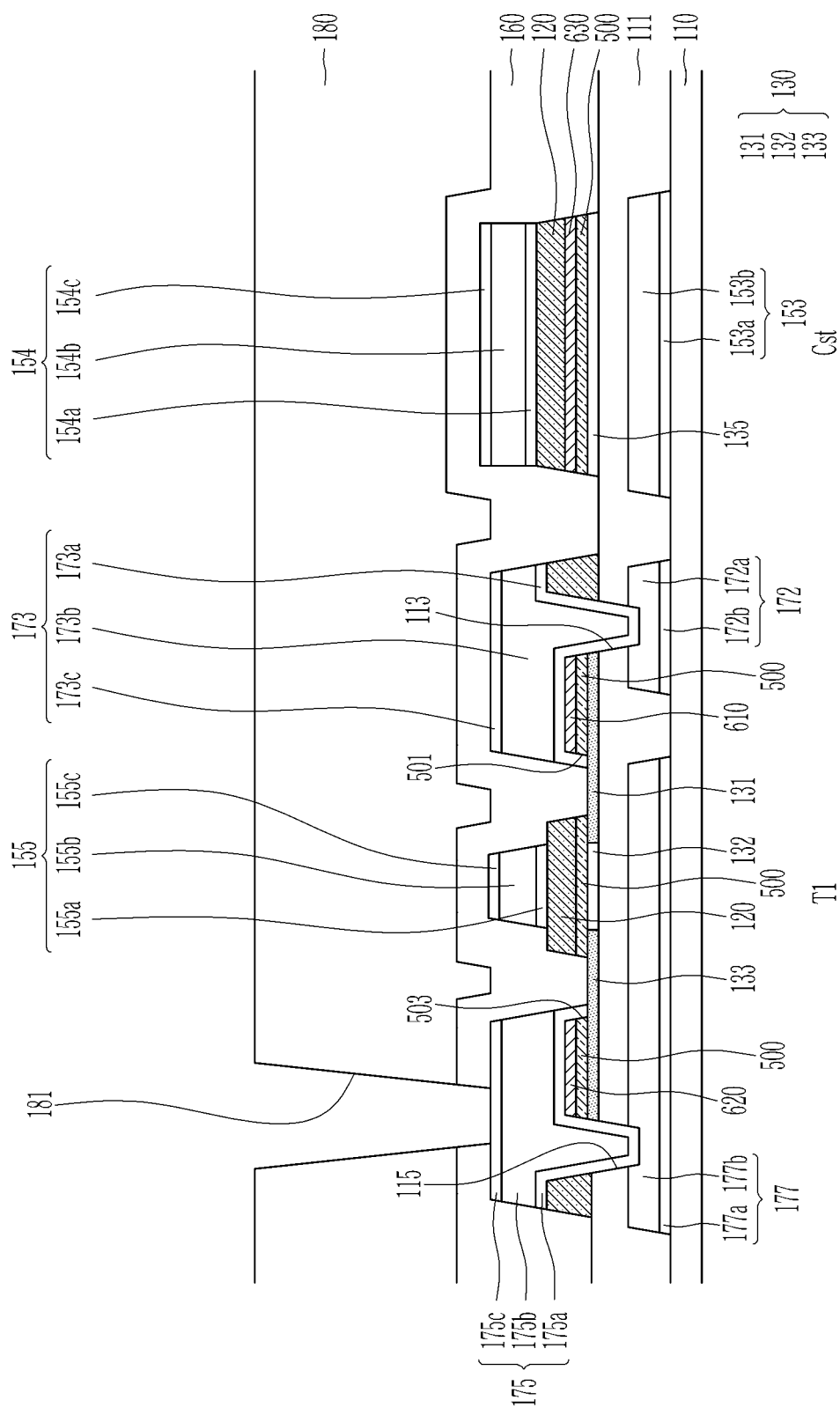

As shown in FIG. 8, the second insulating layer 160 and the third insulating layer 180 are formed on the gate electrode 155, the first electrode 173, the second electrode 175, and the second storage electrode 154, and are patterned to form the opening 181. At least a portion of the upper surface of the second electrode 175 may be exposed by the opening 181.

Figure 9:
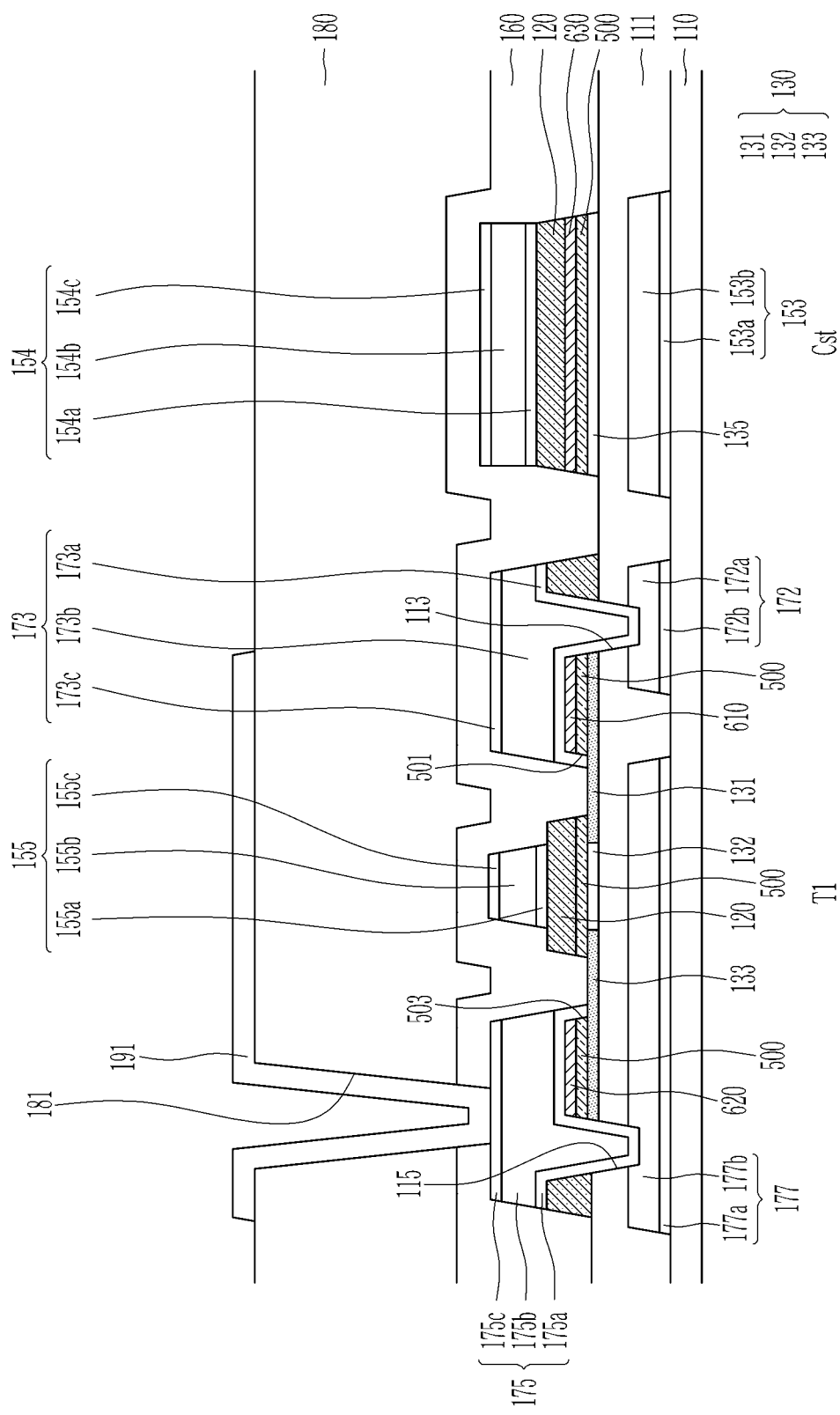

As shown in FIG. 9, the pixel electrode 191 is formed on the third insulating layer 180. The pixel electrode 191 may be connected to the second electrode 175 through the opening 181 of the third insulating layer 180.

Figure 10:
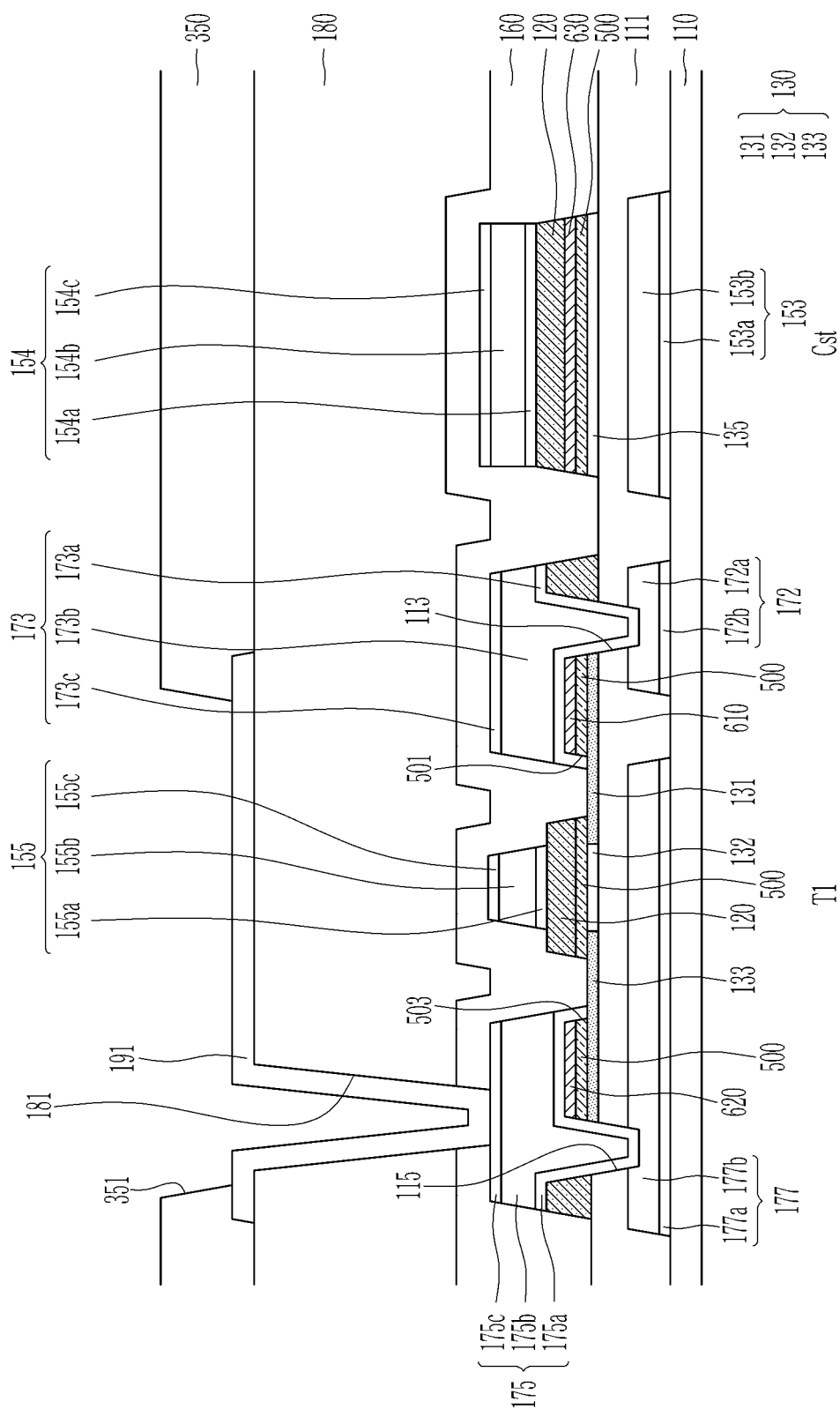

As shown in FIG. 10, the fourth insulating layer 350 is formed on the pixel electrode 191 and the third insulating layer 180, and is patterned to form the opening 351. The opening 351 may overlap with (e.g., may expose) the pixel electrode 191. The opening 351 of the fourth insulating layer 350 may overlap with a central portion of the pixel electrode 191, and may not overlap with an edge of the pixel electrode 191. In other words, the edge of the pixel electrode 191 may be covered by the fourth insulating layer 350.

Figure 11:
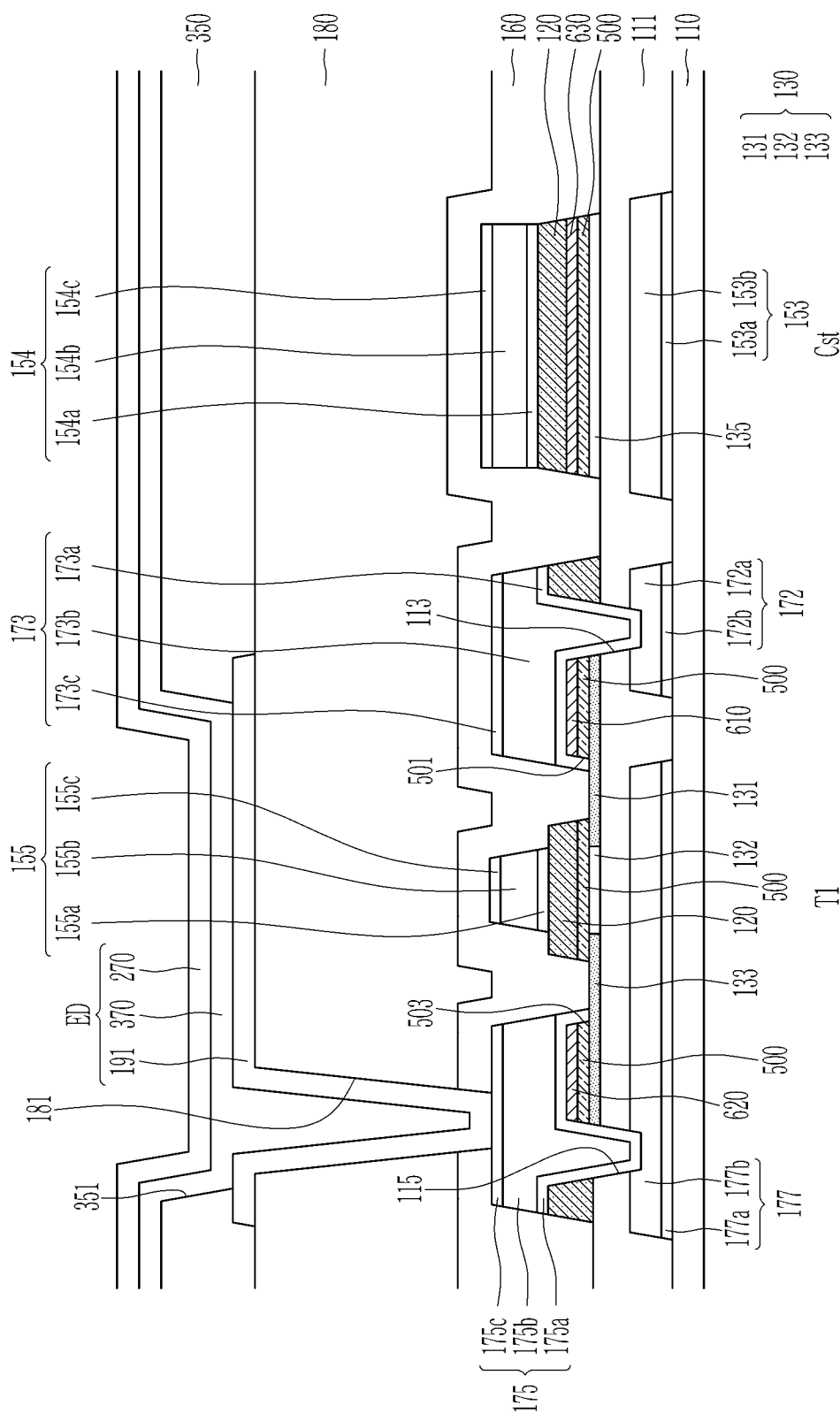

As shown in FIG. 11, the light emitting layer 370 may be formed on the fourth insulating layer 350 and the pixel electrode 191, and the common electrode 270 may be formed on the light emitting layer 370. Although the light emitting layer 370 is illustrated as being entirely formed on the substrate 110, the present disclosure is not limited thereto, and the light emitting layer 370 may be positioned only in the opening 351 of the fourth insulating layer 350. The common electrode 270 may be entirely formed on the substrate 110. The pixel electrode 191, the light emitting layer 370, and the common electrode 270 together may form the light emitting diode ED.

In the display device according to the present embodiment, the gate electrode, the first electrode, and the second electrode configuring the transistor are positioned at (e.g., in or on) the same layer as each other. As such, by forming the gate electrode, the first electrode, and the second electrode together in the same process, the process may be simplified, and costs may be reduced by reducing the number of masks used.

According to the present embodiment, as the display device further includes the auxiliary conductive layer, the capacitor may have a structure including the first storage electrode, the auxiliary storage electrode, and the second storage electrode. Accordingly, a capacity of the capacitor may be sufficiently secured by forming a double capacitor.

In the display device according to the present embodiment, the auxiliary insulating layer is positioned between the semiconductor layer and the auxiliary conductive layer. When the auxiliary conductive layer is formed directly on the semiconductor, a metal material may remain on the channel of the semiconductor during the patterning of the auxiliary conductive layer, and thus, a defect may occur in the transistor. According to the present embodiment, as shown in FIG. 5, in the process of patterning the auxiliary conductive layer, the channel of the semiconductor is covered by the auxiliary insulating layer. Accordingly, the metal material may not remain on the channel of the semiconductor, and thus, a defect may be prevented or substantially prevented from occurring in the transistor.

Hereinafter, a display device and a manufacturing method of the display device according to an embodiment will be described with reference to FIG. 12 to FIG. 14.

The display device and the manufacturing method of the display device according to the embodiment (e.g., hereinafter, the present embodiment) shown in FIG. 12 to FIG. 14 may be the same or substantially the same as the display device and the manufacturing method of the display device according to the embodiment (e.g., hereinafter, the previous embodiment) shown in FIG. 1 to FIG. 11, except that in the present embodiment, the first electrode and the second electrode may not be in contact with the upper surface of the semiconductor. Accordingly, the differences therebetween will be mainly described in more detail hereinafter, and redundant description may not be repeated.

Figure 12:
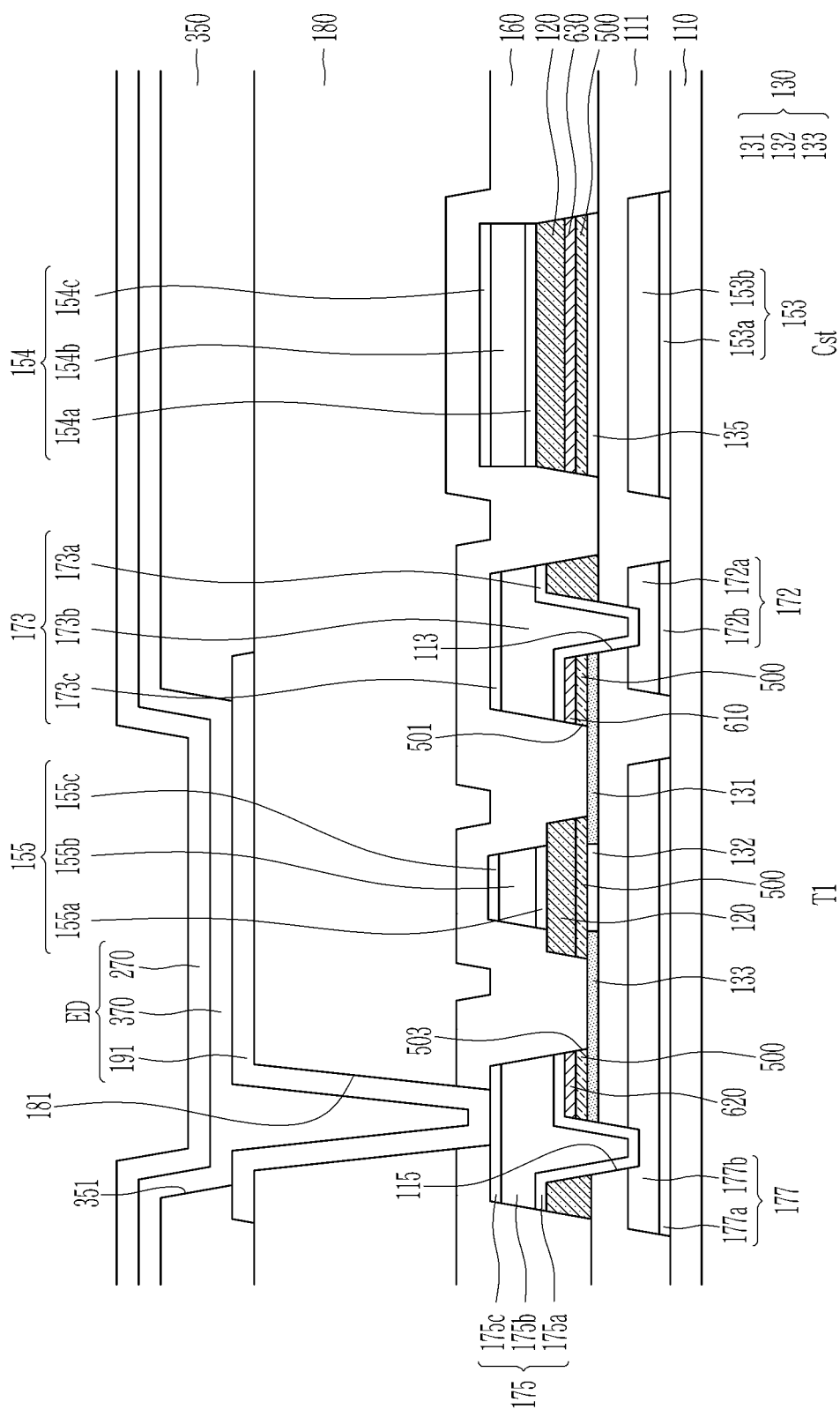
FIG. 12 illustrates a cross-sectional view of a display device according to an embodiment.
Figure 13:
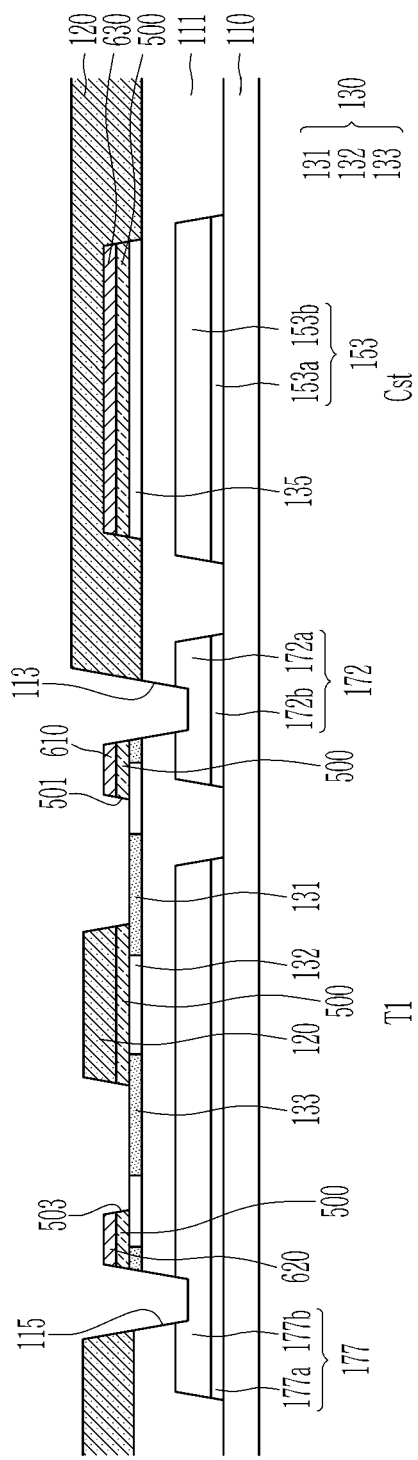
FIGS. 13-14 illustrate partial cross-sectional views of a manufacturing process of a display device according to an embodiment.
Figure 14:
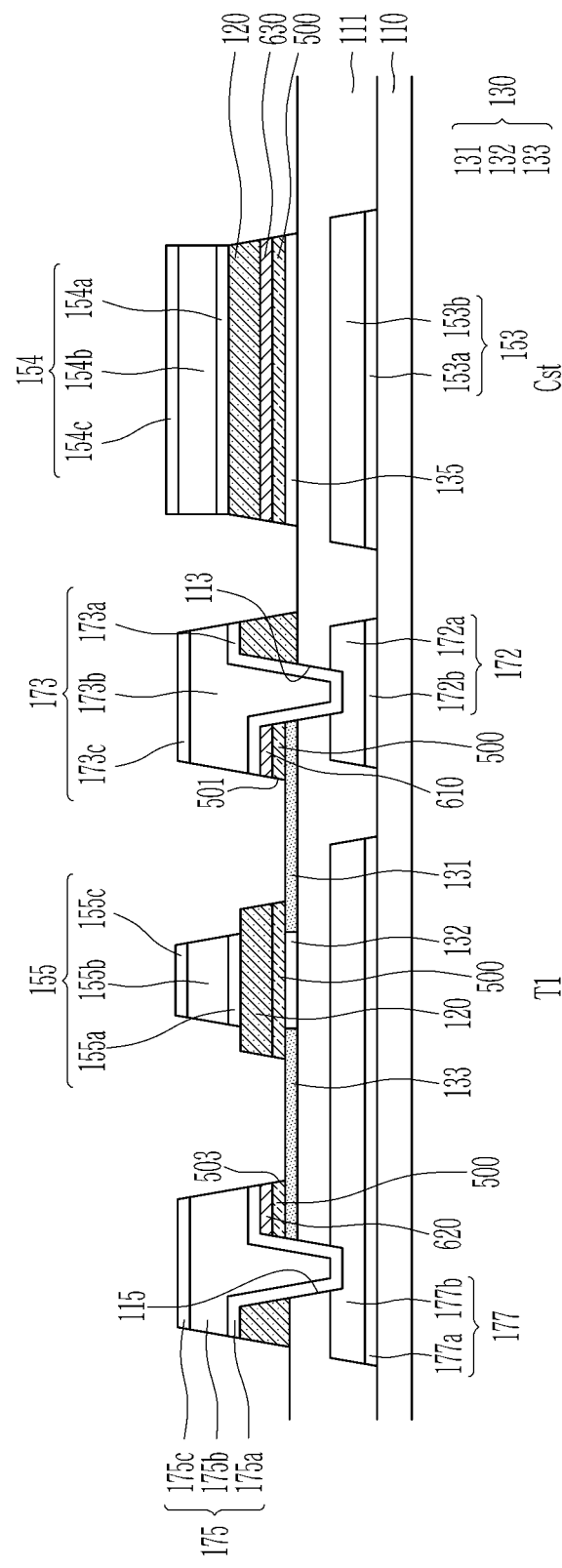

FIG. 12 illustrates a cross-sectional view of a display device according to an embodiment, and FIGS. 13-14 illustrate partial cross-sectional views of a manufacturing process of a display device according to an embodiment.

As shown in FIG. 12, a display device according to an embodiment includes a substrate 110, a semiconductor 130 positioned on the substrate 110, an auxiliary insulating layer 500 positioned on the semiconductor 130, a first auxiliary electrode 610 and a second auxiliary electrode 620 positioned on the auxiliary insulating layer 500, a gate electrode 155 overlapping with a channel 132 of the semiconductor 130, a first electrode 173 positioned on the first auxiliary electrode 610 and connected to a first region 131 of the semiconductor 130, and a second electrode 175 positioned on the second auxiliary electrode 620 and connected to a second region 133 of the semiconductor 130.

In the previous embodiment, the first electrode 173 and the second electrode 175 may be in contact with the side surface and the upper surface of the semiconductor 130, but in the present embodiment, the first electrode 173 and the second electrode 175 may be in contact with the side surface of the semiconductor 130 and may not be in contact with the upper surface of the semiconductor 130.

In the present embodiment, the first electrode 173 may be in contact with the upper surface and the outer surface of the first auxiliary electrode 610, and may not be in contact with the inner surface of the first auxiliary electrode 610. The inner surface of the first auxiliary electrode 610 refers to a side surface thereof that is relatively adjacent to the channel 132 of the semiconductor 130, and the outer surface of the first auxiliary electrode 610 refers to a side surface thereof that is relatively farther from the channel 132 of the semiconductor 130. The first electrode 173 is not positioned within the opening 501 of the auxiliary insulating layer 500. The first electrode 173 may be in contact with the outer surface of the auxiliary insulating layer 500. The first electrode 173 may be in contact with the side surface of the first region 131 of the semiconductor 130, and may not be in contact with the upper surface of the first region 131. The first electrode 173 may cover the upper surface and the outer surface of the first auxiliary electrode 610, the outer surface of the auxiliary insulating layer 500, and the side surface of the first region 131 of the semiconductor 130, and may be formed in the opening 113 of the buffer layer 111. Accordingly, the first electrode 173 may be connected to the side surface of the first region 131 of the semiconductor 130, and may be connected to the driving voltage line 172 via the opening 113.

In the present embodiment, the second electrode 175 may be in contact with the upper surface and the outer surface of the second auxiliary electrode 620, and may not be in contact with the inner surface thereof. The inner surface of the second auxiliary electrode 620 refers to a side surface thereof that is relatively adjacent to the channel 132 of the semiconductor 130, and the outer surface of the second auxiliary electrode 620 refers to a side surface thereof that is relatively farther from the channel 132 of the semiconductor 130. The second electrode 175 is not positioned within the opening 503 of the auxiliary insulating layer 500. The second electrode 175 may be in contact with the outer surface of the auxiliary insulating layer 500. The second electrode 175 may be in contact with the side surface of the second region 133 of the semiconductor 130, but may not be in contact with the upper surface of the second region 133. The second electrode 175 may cover the upper surface and the outer surface of the second auxiliary electrode 620, the outer surface of the auxiliary insulating layer 500, and the side surface of the second region 133 of the semiconductor 130, and may be formed in the opening 115 of the buffer layer 111. Accordingly, the second electrode 175 may be connected to the side surface of the second region 133 of the semiconductor 130, and may be connected to the light blocking pattern 177 via the opening 115.

In the present embodiment, the first region 131 and the second region 133 of the semiconductor 130 are entirely doped. Even if each of the first electrode 173 and the second electrode 175 does not contact the upper surfaces of the first region 131 and the second region 133 of the semiconductor 130, because the first electrode 173 and the second electrode 175 are in contact with the side surfaces of the first region 131 and the second region 133, respectively, the first region 131 of the semiconductor 130 and the first electrode 173 may be connected to each other, and the second region 133 and the second electrode 175 may be connected to each other.

Hereinafter, a process in which doping of the first region and the second region of the semiconductor is smoothly performed in a manufacturing process of a display device according to an embodiment will be described with reference to FIG. 13 and FIG. 14.

As shown in FIG. 13, in the process of patterning the first insulating layer 120 and doping the semiconductor 130, a portion of the first region 131 and the second region 133 of the semiconductor 130 may be doped, and the remaining portion thereof may not be doped. The first region 131 and the second region 133 of the semiconductor 130 exposed by the openings 501 and 503 of the auxiliary insulating layer 500 may be doped. The edges of the first region 131 and the second region 133 of the semiconductor 130 may be doped. The portions of the first region 131 and the second region 133 of the semiconductor 130 that are covered by the first auxiliary electrode 610 and the second auxiliary electrode 620 may not be doped. In the first region 131 and the second region 133, the doped region may be widened as diffusion is made from the doped portion to the non-doped portion.

As shown in FIG. 14, additional diffusion may be performed in the process of forming the second conductive layer, and performing a dry etching process to remove the portion of the first insulating layer 120 that is not covered by the second conductive layer. In this case, by adjusting the widths of the first auxiliary electrode 610 and the second auxiliary electrode 620, the first region 131 and the second region 133 of the semiconductor 130 may have uniform or substantially uniform doping concentrations as a whole. Accordingly, even if the first electrode 173 and the second electrode 175 contacts only the side surfaces of the first region 131 and the second region 133, respectively, of the semiconductor 130, the semiconductor 130 and the first electrode 173 and second electrode 175 may be smoothly connected.

Figure 15:
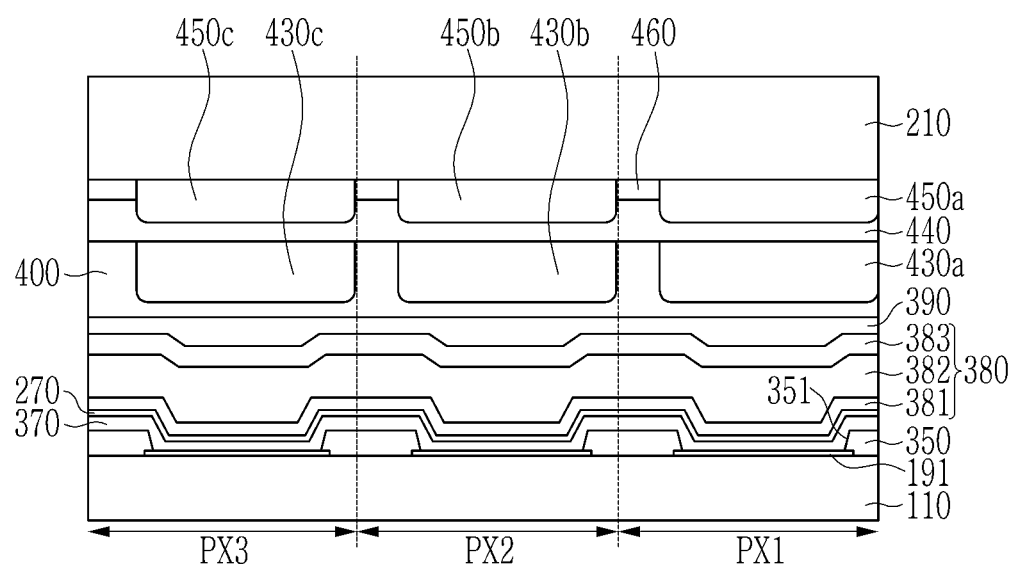
FIG. 15 illustrates a cross-sectional view of some constituent elements of a display device according to an embodiment.

Hereinafter, a cross-sectional structure of a display device according to an embodiment will be further described with reference to FIG. 15. FIG. 15 will be described with reference to the drawings of several embodiments described above. In the drawings of the several embodiments described above, the common electrode is shown as an uppermost layer, but another layer may be further positioned thereon, which will be described in more detail below.

FIG. 15 illustrates a cross-sectional view of some constituent elements of a display device according to an embodiment. For convenience of illustration, FIG. 15 illustrates constituent elements that may be positioned on the third insulating layer (e.g., 180), and the driving voltage line, the transistor, the capacitor, and the like of the display device according to the embodiments described above are not shown.

As shown in FIG. 15, the display device according to an embodiment may include a first pixel PX1, a second pixel PX2, and a third pixel PX3. On the substrate 110, a plurality of the pixel electrode 191 may be positioned at (e.g., in or on) the first pixel PX1, the second pixel PX2, and the third pixel PX3, respectively. A transistor, a capacitor, an insulating layer, and the like may be positioned between the substrate 110 and the pixel electrode 191, for example, such as those shown in the drawings of the various embodiments described above.

The fourth insulating layer 350 may be positioned on the pixel electrode 191, and the fourth insulating layer 350 may include the opening 351. The light emitting layer 370 may be positioned on the pixel electrode 191 and the fourth insulating layer 350, and the common electrode 270 may be positioned on the light emitting layer 370. The light emitting layer 370 may include a light emitting material that emits light of a first color, which may be blue light.

An encapsulation layer 380 may be positioned on the common electrode 270. The encapsulation layer 380 may include at least one inorganic film, and at least one organic film. For example, the encapsulation layer 380 may include a first inorganic encapsulation layer 381, an organic encapsulation layer 382, and a second inorganic encapsulation layer 383. However, the present disclosure is not limited thereto, and the number of inorganic and organic films configuring the encapsulation layer 380 may be variously modified as needed or desired. The display device according to the present embodiment may include a display area for displaying a screen, and a peripheral area surrounding (e.g., around a periphery of) the display area. The first inorganic encapsulation layer 381, the organic encapsulation layer 382, and the second inorganic encapsulation layer 383 may be partially positioned at (e.g., in or on) the display area and the peripheral area. In some embodiments, the organic encapsulation layer 382 may be formed around the display area, and the first inorganic encapsulation layer 381 and the second inorganic encapsulation layer 383 may be formed even at (e.g., in or on) the peripheral area. The encapsulation layer 380 may protect the light emitting element ED from moisture and/or oxygen that may be introduced from the outside, and end portions (e.g., one end portions) of the first inorganic encapsulation layer 381 and the second inorganic encapsulation layer 383 may be formed to directly contact each other.

A filling layer 390 containing a filler may be positioned on the encapsulation layer 380. A cover layer 400 including an insulating material, a plurality of color conversion layers 430a and 430b, and a transmissive layer 430c may be positioned on the filling layer 390.

The transmissive layer 430c may transmit incident light. In other words, the transmissive layer 430c may transmit the first color light, which may be the blue light. The transmissive layer 430c may include a polymer material that transmits the first color light. An area in which the transmissive layer 430c is positioned may correspond to a light emitting area that emits blue light, and the transmissive layer 430c may transmit the incident first color light as-is without including a separate semiconductor nanocrystal.

The color conversion layers 430a and 430b may include different semiconductor nanocrystals from each other. For example, the first color light incident on the color conversion layer 430a may be converted into second color light by the semiconductor nanocrystal included in the color conversion layer 430a to be emitted. The first color light incident on the color conversion layer 430b may be converted into third color light by the semiconductor nanocrystal included in the color conversion layer 430b to be emitted.

The semiconductor nanocrystal may include at least one of phosphor or quantum dot materials that convert the incident first color light into the second color light or the third color light.

A core of the quantum dot may be selected from a group II-VI compound, a group III-V compound, a group IV-VI compound, a group IV element, a group IV compound, and/or a suitable combination thereof.

The Group II-VI compound may be selected from a two-element compound selected from CdSe, CdTe, ZnS, ZnSe, ZnTe, ZnO, HgS, HgSe, HgTe, MgSe, MgS, and a mixture thereof; a three-element compound selected from AgInS, CuInS, CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and a mixture thereof; and a four-element compound selected from HgZnTeS, CdZnSeS, CdZnSeTe, CdZnSTe, CdHgSeS, CdHgSeTe, CdHgSTe, HgZnSeS, HgZnSeTe, HgZnSTe, and a mixture thereof.

The Group III-V compound may be selected from a two-element compound selected from GaN, GaP, GaAs, GaSb, AlN, AlP, AlAs, AlSb, InN, InP, InAs, InSb, and a mixture thereof; a three-element compound selected from GaNP, GaNAs, GaNSb, GaPAs, GaPSb, AlNP, AlNAs, AlNSb, AlPAs, AlPSb, InGaP, InNP, InNAs, InNSb, InPAs, InPSb, GaAlNP, and a mixture thereof; and a four-element compound selected from GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and a mixture thereof.

The Group IV-VI compound may be selected from a two-element compound selected from SnS, SnSe, SnTe, PbS, PbSe, PbTe, and a mixture thereof; a three-element compound selected from SnSeS, SnSeTe, SnSTe, PbSeS, PbSeTe, PbSTe, SnPbS, SnPbSe, SnPbTe, and a mixture thereof; and a four-element compound selected from SnPbSSe, SnPbSeTe, SnPbSTe, and a mixture thereof. The Group IV element may be selected from Si, Ge, and a mixture thereof. The Group IV compound may be a two-element compound selected from SiC, SiGe, and a mixture thereof.

In this case, the two-element compound, the three-element compound, or the four-element compound may be present in particles at uniform or substantially uniform concentrations, or they may be divided into states having partially different concentrations to be present in the same particle, respectively. In addition, a core/shell structure in which some quantum dots enclose some other quantum dots may be implemented. An interface between the core and the shell may have a concentration gradient in which a concentration of elements of the shell decreases closer to its center.

In some embodiments, the quantum dot may have a core-shell structure that includes a core including the nanocrystal described above, and a shell surrounding (e.g., around a periphery of) the core. The shell of the quantum dot may serve as a passivation layer for maintaining or substantially maintaining a semiconductor characteristic, and/or as a charging layer for applying an electrophoretic characteristic to the quantum dot by preventing or substantially preventing chemical denaturation of the core. The shell may be a single layer or multilayers. An interface between the core and the shell may have a concentration gradient in which a concentration of elements of the shell decreases closer to its center. An example of the shell of the quantum dot includes a metal or nonmetal oxide, a semiconductor compound, or a combination thereof.

For example, the metal or nonmetal oxide may be a two-element compound, such as $SiO_2$, $Al_2O_3$, $TiO_2$, ZnO, MnO, $Mn_2O_3$, $Mn_3O_4$, CuO, FeO, $Fe_2O_3$, $Fe_3O_4$, CoO, $Co_3O_4$, NiO, and the like, or a three-element compound, such as $MgAl_2O_4$, $CoFe_2O_4$, $NiFe_2O_4$, $CoMn_2O_4$, and the like, but the present disclosure is not limited thereto.

In addition, the semiconductor compound may be CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, AlSb, or the like, but the present disclosure is not limited thereto.

The quantum dot may have a full width at half maximum (FWHM) of the light-emitting wavelength spectrum that is equal to or less than about 45 nm, equal to or less than about 40 nm, or equal to or less than about 30 nm. In these ranges, color purity or color reproducibility may be improved. In addition, because light emitted through the quantum dot is emitted in all directions, a viewing angle of light may be improved.

Further, a shape of the quantum dot is not particularly limited to a shape generally used in the art, and may be a spherical, pyramidal, multi-armed, or cubic nanoparticles, nanotubes, nano-wires, nano-fiber, a nano-plate particle shape, and the like.

The quantum dot may control a color of emitted light according to a particle size thereof, and thus the quantum dot may have various light emitting colors such as blue, red, and green colors.

An insulating layer 440 may be positioned on the plurality of color conversion layers 430a and 430b and the transmissive layer 430c, and a plurality of color filters 450a, 450b, and 450c and a light blocking member 460 may be positioned thereon.

The color filter 450a may display the second color light, the color filter 450b may display the third color light, and the color filter 450c may display the first color light.

The light blocking member 460 may be positioned between adjacent color filters 450a, 450b, and 450c.

A substrate 210 may be positioned on the plurality of color filters 450a, 450b, and 450c and the light blocking member 460. In other words, a plurality of color conversion layers 430a and 430b and a plurality of color filters 450a, 450b, and 450c may be positioned between the substrate 110 and the substrate 210.

According to another embodiment, instead of including the plurality of color conversion layers 430a and 430b and the transmissive layer 430c, the light emitting layer 370 may include quantum dots.

Although some embodiments have been described, those skilled in the art will readily appreciate that various modifications are possible in the embodiments without departing from the spirit and scope of the present disclosure. It will be understood that descriptions of features or aspects within each embodiment should typically be considered as available for other similar features or aspects in other embodiments, unless otherwise described. Thus, as would be apparent to one of ordinary skill in the art, features, characteristics, and/or elements described in connection with a particular embodiment may be used singly or in combination with features, characteristics, and/or elements described in connection with other embodiments unless otherwise specifically indicated. Therefore, it is to be understood that the foregoing is illustrative of various example embodiments and is not to be construed as limited to the specific embodiments disclosed herein, and that various modifications to the disclosed embodiments, as well as other example embodiments, are intended to be included within the spirit and scope of the present disclosure as defined in the appended claims, and their equivalents.

DESCRIPTION OF SYMBOLS

110: substrate
111: buffer layer
120: first insulating layer
130: semiconductor
131: first region of semiconductor
132: channel of semiconductor
133: second region of semiconductor
153: first storage electrode
154: second storage electrode
172: driving voltage line
173: first electrode
175: second electrode
177: light blocking pattern
500: auxiliary insulating layer
610: first auxiliary electrode
620: second auxiliary electrode
630: auxiliary storage electrode

What is claimed is:

1. A display device comprising:
a substrate;
a semiconductor on the substrate, and comprising a channel, a first region, and a second region;
an auxiliary insulating layer on the semiconductor;
a first auxiliary electrode on the auxiliary insulating layer, and overlapping with the first region of the semiconductor;
a second auxiliary electrode on the auxiliary insulating layer, and overlapping with the second region of the semiconductor;
a gate electrode on the auxiliary insulating layer, and overlapping with the channel of the semiconductor;
a first electrode on the first auxiliary electrode, and connected to the first region of the semiconductor, the first electrode directly contacting at least a first side surface of the semiconductor; and
a second electrode on the second auxiliary electrode, and connected to the second region of the semiconductor, the second electrode directly contacting at least a second side surface of the semiconductor opposite to the first side surface.

2. The display device of claim 1, wherein the gate electrode, the first electrode, and the second electrode are at a same layer as each other.

3. The display device of claim 1, wherein:
the first electrode is in contact with a side surface of the first region of the semiconductor; and
the second electrode is in contact with a side surface of the second region of the semiconductor.

4. The display device of claim 3, wherein:
the first auxiliary electrode includes an inner side surface and an outer side surface, the inner side surface of the first auxiliary electrode being more adjacent to the channel of the semiconductor compared with the outer side surface of the first auxiliary electrode;
the second auxiliary electrode includes an inner side surface and an outer side surface, the inner side surface of the second auxiliary electrode being more adjacent to the channel of the semiconductor compared with the outer side surface of the second auxiliary electrode;
the auxiliary insulating layer is located between the first region of the semiconductor and the first auxiliary electrode, and between the second region of the semiconductor and the second auxiliary electrode;
the auxiliary insulating layer includes an inner side surface and an outer side surface, the inner side surface of the auxiliary insulating layer being more adjacent to the channel of the semiconductor compared with the outer side surface of the auxiliary insulating layer;
the first electrode continuously covers an upper surface and the outer side surface of the first auxiliary electrode, and the outer side surface of the auxiliary insulating layer; and
the second electrode continuously covers an upper surface and the outer side surface of the second auxiliary electrode, and the outer side surface of the auxiliary insulating layer.

5. The display device of claim 4, wherein:
the first electrode continuously covers the inner side surface of the first auxiliary electrode and the inner side surface of the auxiliary insulating layer; and
the second electrode continuously covers the inner side surface of the second auxiliary electrode and the inner side surface of the auxiliary insulating layer.

6. The display device of claim 3, wherein:
the auxiliary insulating layer includes a first opening overlapping with a portion of the first region, and a second opening overlapping with a portion of the second region;
the first electrode is in contact with an upper surface of the first region of the semiconductor within the first opening; and
the second electrode is in contact with an upper surface of the second region of the semiconductor within the second opening.

7. The display device of claim 1, further comprising:
a driving voltage line and a light blocking pattern spaced from each other on the substrate; and
a buffer layer on the driving voltage line and the light blocking pattern,
wherein the semiconductor is on the buffer layer.

8. The display device of claim 7, wherein the buffer layer includes:
a third opening overlapping with the driving voltage line and the first electrode; and
a fourth opening overlapping with the light blocking pattern and the second electrode, and
wherein the first electrode is connected to the driving voltage line through the third opening, and the second electrode is connected to the light blocking pattern through the fourth opening.

9. The display device of claim 7, further comprising:
a first storage electrode located at a same layer as that of the driving voltage line and the light blocking pattern;
a dummy semiconductor overlapping with the first storage electrode, and located at a same layer as that of the semiconductor;
an auxiliary storage electrode overlapping with the first storage electrode, and located at a same layer as that of the first auxiliary electrode and the second auxiliary electrode; and
a second storage electrode overlapping with the auxiliary storage electrode, and located at a same layer as that of the gate electrode, the first electrode, and the second electrode.

10. The display device of claim 9, further comprising a first insulating layer between the auxiliary insulating layer and the gate electrode,
wherein:
the first insulating layer is further between the auxiliary storage electrode and the second storage electrode;
the auxiliary insulating layer is further between the dummy semiconductor and the auxiliary storage electrode; and
the buffer layer is further between the first storage electrode and the dummy semiconductor.

11. A manufacturing method of a display device, comprising:
sequentially depositing a semiconductor material layer, an auxiliary insulating material layer, and an auxiliary conductive material layer on a substrate;
patterning the semiconductor material layer, the auxiliary insulating material layer, and the auxiliary conductive material layer to form a semiconductor comprising a channel, a first region, and a second region, an auxiliary insulating layer, a first auxiliary electrode, and a second auxiliary electrode; and
forming a gate electrode overlapping with the channel of the semiconductor, a first electrode connected to the first region of the semiconductor, and a second electrode connected to the second region of the semiconductor,
wherein during the patterning of the auxiliary conductive material layer, an upper surface of the semiconductor is covered by the auxiliary insulating material layer, and
wherein the first electrode directly contacts at least a first side surface of the semiconductor, and the second electrode directly contacts at least a second side surface of the semiconductor opposite to the first side surface.

12. The manufacturing method of claim 11, wherein the gate electrode, the first electrode, and the second electrode are located at a same layer as each other.

13. The manufacturing method of claim 11, wherein:
the first electrode is in contact with a side surface of the first region of the semiconductor; and
the second electrode is in contact with a side surface of the second region of the semiconductor.

14. The manufacturing method of claim 13, wherein:
the first auxiliary electrode includes an inner side surface and an outer side surface, the inner side surface of the first auxiliary electrode being more adjacent to the channel of the semiconductor compared with the outer side surface of the first auxiliary electrode;
the second auxiliary electrode includes an inner side surface and an outer side surface, the inner side surface of the second auxiliary electrode being more adjacent to the channel of the semiconductor compared with the outer side surface of the second auxiliary electrode;

the auxiliary insulating layer is located between the first region of the semiconductor and the first auxiliary electrode, and between the second region of the semiconductor and the second auxiliary electrode;
the auxiliary insulating layer includes an inner side surface and an outer side surface, the inner side surface of the auxiliary insulating layer being more adjacent to the channel of the semiconductor compared with the outer side surface of the auxiliary insulating layer;
the first electrode continuously covers an upper surface and the outer side surface of the first auxiliary electrode, and the outer side surface of the auxiliary insulating layer; and
the second electrode continuously covers an upper surface and the side outer surface of the second auxiliary electrode, and the outer side surface of the auxiliary insulating layer.

15. The manufacturing method of claim 14, wherein:
the first electrode continuously covers the inner side surface of the first auxiliary electrode and the inner side surface of the auxiliary insulating layer; and
the second electrode continuously covers the inner side surface of the second auxiliary electrode and the inner side surface of the auxiliary insulating layer.

16. The manufacturing method of claim 13, further comprising:
forming a first opening and a second opening in the auxiliary insulating layer, the first opening overlapping with a portion of the first region, and the second opening overlapping with a portion of the second region; and
doping the first region and the second region,
wherein the first electrode is in contact with an upper surface of the first region of the semiconductor within the first opening, and the second electrode is in contact with an upper surface of the second region of the semiconductor within the second opening.

17. The manufacturing method of claim 11, further comprising:
forming a driving voltage line and a light blocking pattern on the substrate; and
forming a buffer layer on the driving voltage line and the light blocking pattern,
wherein the semiconductor material layer, the auxiliary insulating material layer, and the auxiliary conductive material layer are sequentially deposited on the buffer layer.

18. The manufacturing method of claim 17, further comprising forming in the buffer layer, a third opening overlapping with the driving voltage line, and a fourth opening overlapping the light blocking pattern,
wherein the first electrode is connected to the driving voltage line through the third opening, and the second electrode is connected to the light blocking pattern through the fourth opening.

19. The manufacturing method of claim 17, wherein:
in the forming of the driving voltage line and the light blocking pattern, a first storage electrode is further formed;
in the forming of the semiconductor, a dummy semiconductor overlapping with the first storage electrode is further formed;
in the forming of the first auxiliary electrode and the second auxiliary electrode, an auxiliary storage electrode overlapping with the first storage electrode is further formed; and in the forming of the gate electrode, the first electrode, and the second electrode, a second storage electrode overlapping with the auxiliary storage electrode is further formed.

20. The manufacturing method of claim 19, further comprising forming a first insulating layer on the auxiliary insulating layer and the auxiliary storage electrode, wherein the gate electrode and the second storage electrode are located on the first insulating layer.

* * * * *